(12) United States Patent
Saito et al.

(10) Patent No.: US 7,531,816 B2
(45) Date of Patent: May 12, 2009

(54) VACUUM CONVEYING APPARATUS AND CHARGED PARTICLE BEAM EQUIPMENT WITH THE SAME

(75) Inventors: Hiroyuki Saito, Hitachinaka (JP); Shouji Tomida, Hitachinaka (JP)

(73) Assignee: Hitachi High-Technologies Corporation, Tokyo (JP)

(*) Notice: Subject to any disclaimer, the term of this patent is extended or adjusted under 35 U.S.C. 154(b) by 465 days.

(21) Appl. No.: 11/497,244

(22) Filed: Aug. 2, 2006

(65) Prior Publication Data
US 2007/0029504 A1    Feb. 8, 2007

(30) Foreign Application Priority Data

Aug. 2, 2005   (JP)  .............................. 2005-224270
Aug. 5, 2005   (JP)  .............................. 2005-227401

(51) Int. Cl.
G01F 23/00    (2006.01)
G01K 5/08     (2006.01)
G01K 5/10     (2006.01)

(52) U.S. Cl. ............................ 250/441.11; 250/442.11; 250/396 R; 250/310; 250/311; 250/306; 250/307; 250/492.1; 250/443.1; 250/402.21; 250/492.2; 356/385; 384/12; 277/432; 277/913; 118/719; 118/723 R; 118/723 MP; 118/723 MW; 118/723 I; 118/723 HC; 427/248.1; 414/217; 414/939

(58) Field of Classification Search ............ 250/441.11, 250/442.11, 396 R, 310, 311, 306, 307, 492.2, 250/443.1, 492.21, 492.1; 356/395; 384/12; 277/432, 913; 118/719, 723 R, 723 MP, 118/723 MW, 723 I, 723 HC; 427/248.1; 414/217, 939
See application file for complete search history.

(56) References Cited

U.S. PATENT DOCUMENTS 5,628,828 A * 5/1997 Kawamura et al. .......... 118/719

FOREIGN PATENT DOCUMENTS

| JP | 7-142551 | 6/1995 |
| JP | 7-142552 | 6/1995 |
| JP | 8-195427 | 7/1996 |
| JP | 9-283588 | 10/1997 |
| JP | 10-261377 | 9/1998 |
| JP | 2001-118905 | 4/2001 |

* cited by examiner

*Primary Examiner*—Jack I Berman
*Assistant Examiner*—Meenakshi S Sahu
(74) *Attorney, Agent, or Firm*—McDermott Will & Emery LLP

(57) ABSTRACT

A charged particle beam examination equipment for examining and measuring a semiconductor wafer, comprising a wafer exchange portion for exchanging an unexamined wafer and an examiner wafer with each other, which has a first arm longitudinally sliding for reciprocation, a first wafer gripping part provided to the distal end of the first arm, for gripping/releasing the wafer, a second arm longitudinally sliding for reciprocation, and a second wafer gripping part provided to the distal end of the second arm, for gripping/releasing the wafer. The apparatus may shorten the time required for exchange of the wafers so as to enhance the throughput during examination and measurement of the wafers.

10 Claims, 20 Drawing Sheets

FIG. 5A
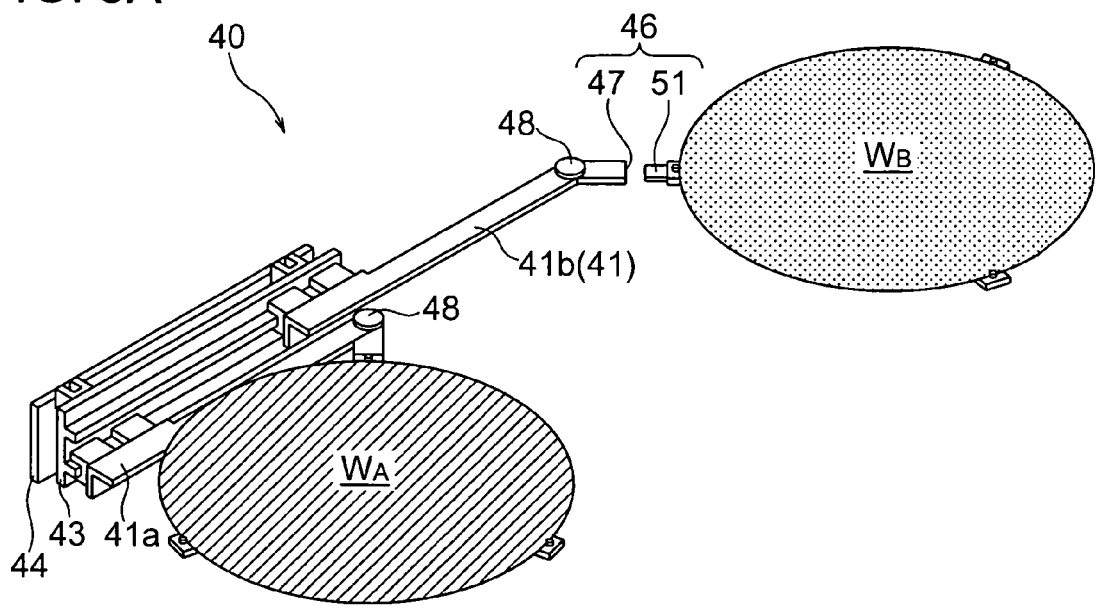
FIG. 5B
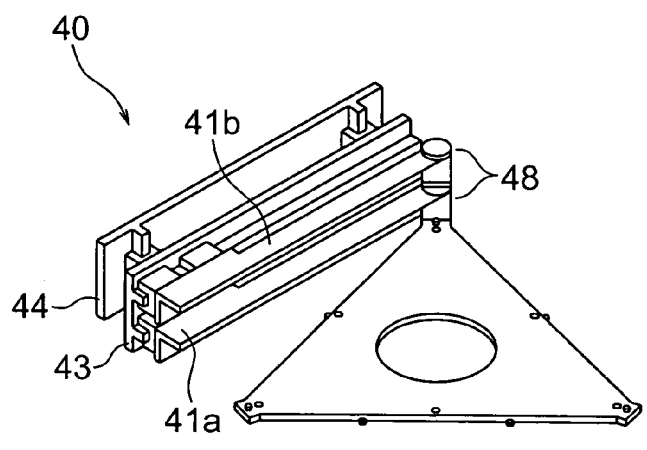
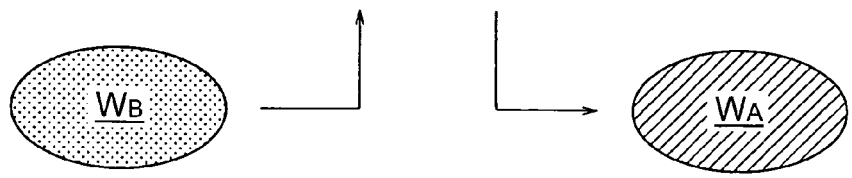

FIG. 7A1
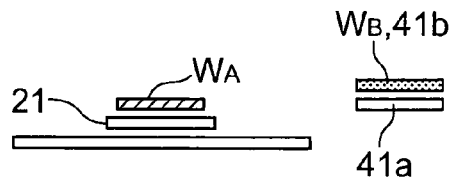
FIG. 7A2
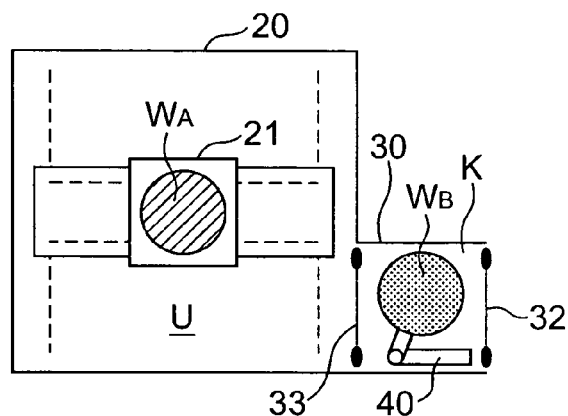
FIG. 7B1
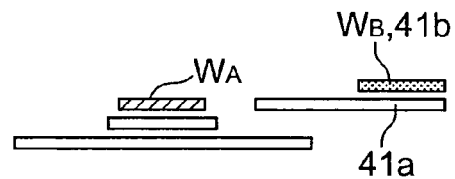
FIG. 7B2
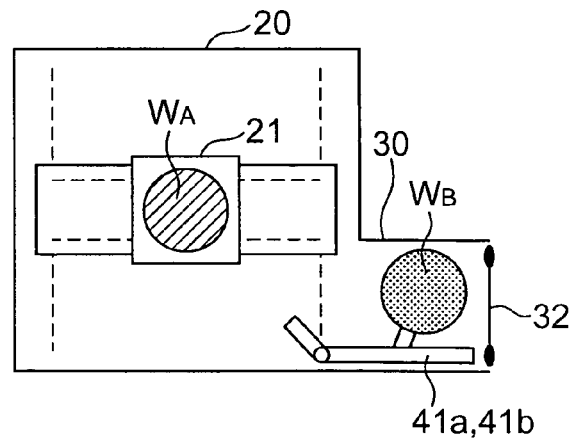

FIG. 7C1
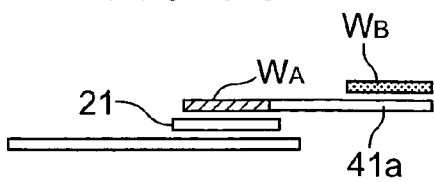
FIG. 7C2
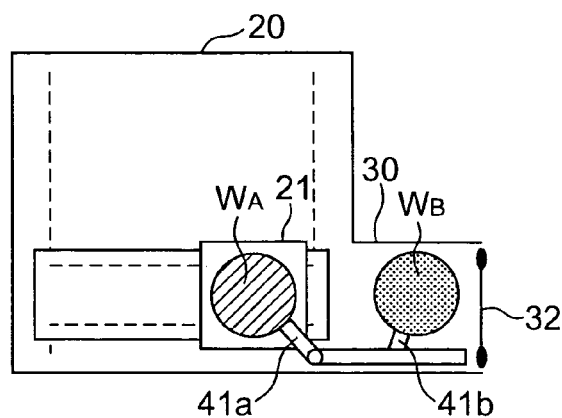
FIG. 7D1
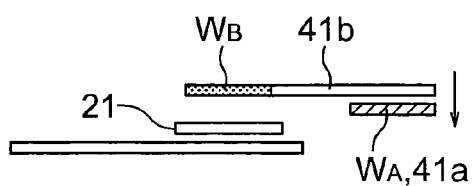
FIG. 7D2
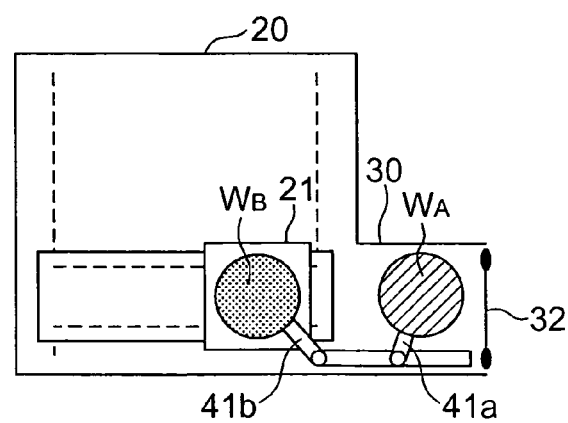

FIG. 7E1
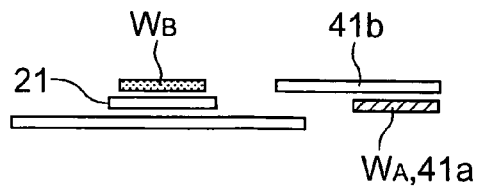
FIG. 7E2
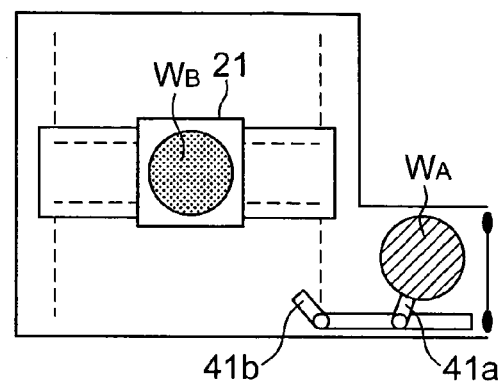
FIG. 7F1
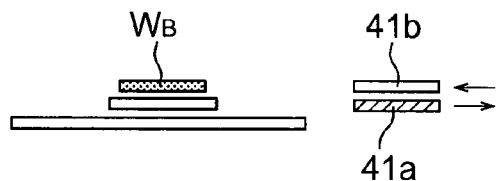
FIG. 7F2
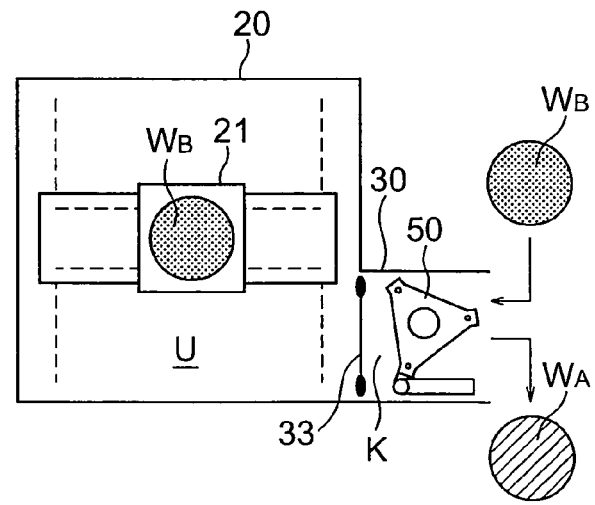

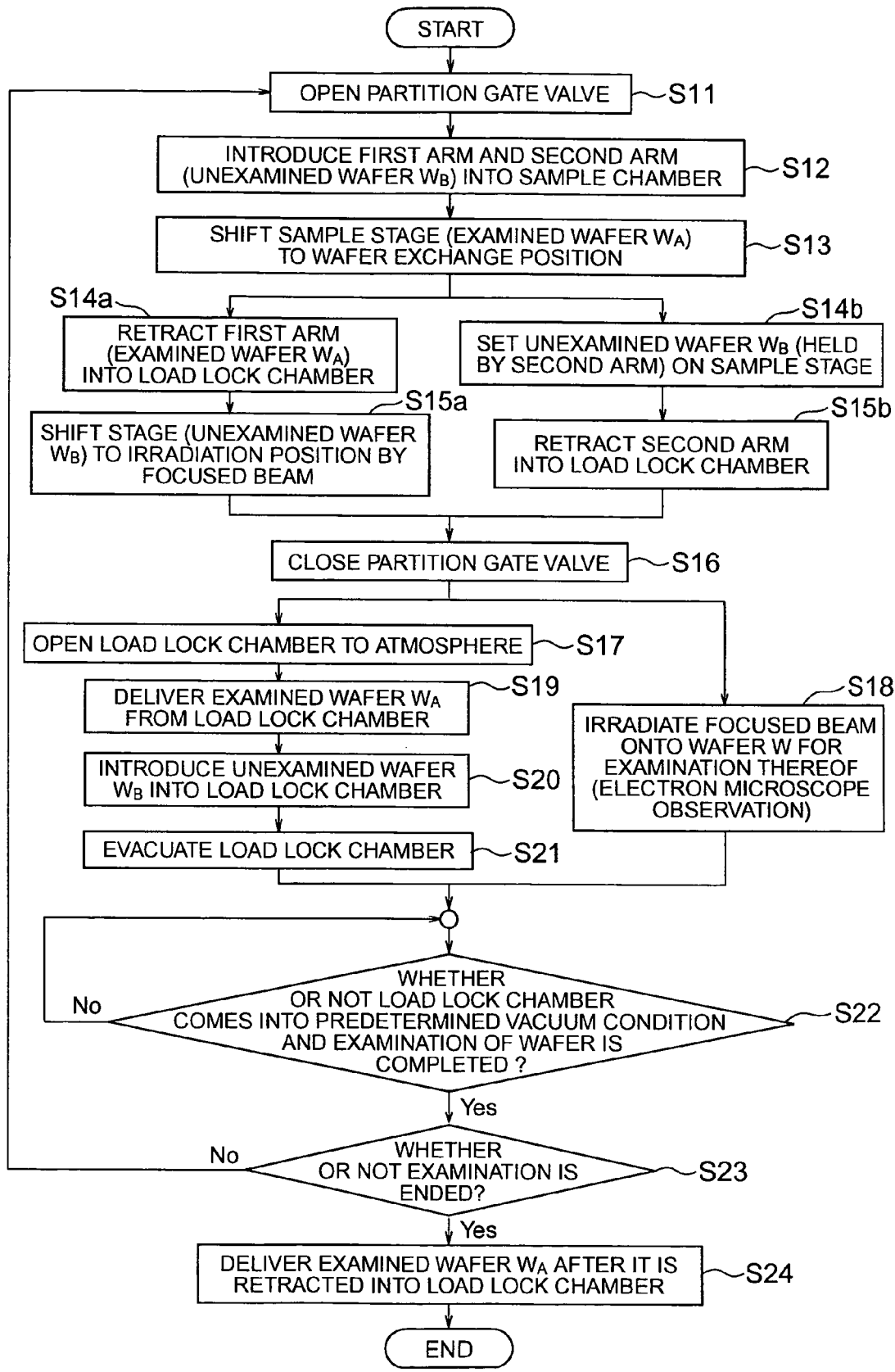

VACUUM CONVEYING APPARATUS AND CHARGED PARTICLE BEAM EQUIPMENT WITH THE SAME

BACKGROUND OF THE INVENTION

The present invention relates to a charged particle beam equipment for examining and measuring semiconductor wafers, and in particular, to a waver exchange mechanism.

In an electron microscope for observing and examining an outer surface of a semiconductor wafer, it is required to rapidly exchange wafers to be examined having a size of up to 300 mm. Accordingly, it is required to shorten the waiting time until a next wafer to be examined is set in a sample chamber where a wafer is irradiated with a focused beam, after a preceding wafer is examined.

Referring to FIG. 9, explanation will be made of the background technology.

A wafer exchange-mechanism for wafers W ($W_A$, $W_B$) in a conventional electron microscope 80 comprises a sample chamber 81 in which a focused beam emitted from an electron optical system column 83 is irradiated to a wafer $W_A$, and a plurality of load lock chambers 82a, 82b (two chambers in the case shown in the figure) which are adjacent to the sample chamber 81.

Further, while the wafer $W_A$ is irradiated with the focused beam in the center part of the sample chamber 81 so as to be examined, an unexamined wafer $W_B$ which will be exchanged at the next time is prepared in either one of the load lock chambers 82a, 82b. Specifically, as shown in FIG. 9, an unexamined wafer $W_B$ is introduced into the load lock chamber 82a from the outside, and the interior space therein is evacuated (Refer to the arrow D1).

Further, after the examination in the sample chamber 81 is completed, a sample stage 85 carrying thereon the examined wafer $W_A$ is set alongside the road lock chamber 82b (the arrow D2), as indicated in a solid line of FIG. 9, and then, a wafer exchange mechanism 84b is operated so as to withdraw the examined wafer $W_A$ (the arrow D3). Next, the sample stage 85 is set alongside the load lock chamber 82a (the arrow D4), and the wafer exchange mechanism 84a is operated so as to newly set the unexamined wafer $W_B$ on the sample stage 85 (the arrow D5). During this period, the examined wafer $W_A$ is delivered from the load lock chamber 82b (the arrow D6) while an unexamined wafer (which is not shown) is newly introduced into the lock chamber 82b.

Further, the sample stage 85 is moved to a position directly below the photoelectric system column 83 at the center of the sample chamber 81 (the arrow D7) so as to start the examination of the wafer $W_B$.

Thus, during the examination of the wafer $W_B$, the load lock chamber 82b into which the unexamined wafer (which is not shown) to be next examined is introduced is evacuated.

Further, when the examination of the wafer $W_B$ is completed, the sample stage 85 carrying thereon the examined wafer $W_B$ is set alongside the load lock chamber 82b (the arrow D8) as indicated by the broken line in FIG. 9. Next, the wafer exchange mechanism 84a is operated to withdraw the examined wafer $W_B$ into the load lock chamber 82a (the arrow D9), and thereafter, it is delivered outside (the arrow D10). The above-mentioned steps will be repeated thereafter.

Thus, in the prior art configuration, with the provision of two load lock chambers 82a, 82b, the waiting time for exchanging the examined wafer $W_A$ and the unexamined wafer $W_B$ on the sample stage 85 has been aimed at being shortened. Further, the preparation of the next wafer to be examined is completed while the wafer is examined in the sample chamber 81, and the examination for the next wafer continuously follows as soon as the examination at present is completed. As stated above, it has been conventionally aimed at speeding up the examination of the wafer (Refer to for example, FIG. 1 in JP-A-10-261377).

Further, in a semiconductor examination apparatus which carry out an examination process for a semiconductor wafer under a depressurized atmosphere, it has been required to enhance through-put, to save footprint (to save foot space) and the like.

The reason as to the above-mentioned requirements is such that the mass production of semiconductor devices (enhancement of the production yield thereof) and reduction of an occupying space in a clean room according to the foot print saving can greatly contribute to cost reduction of the semiconductor devices.

In view of the above-mentioned background, in the semiconductor examination apparatus utilizing a charged particle beam, the vacuum sample chamber are provided with auxiliary exhaust chambers (load lock chambers) having a volume smaller than that of the vacuum sample chamber and isolated therefrom by gate valves through which they can be communicated with the vacuum sample chamber, and accordingly, semiconductor wafers or the like are introduced into or delivered from the vacuum sample chamber by way of the auxiliary exhaust chambers by means of a conveying device, or a transfer device.

With this configuration, the semiconductor wafers can be introduced into and delivered from the vacuum sample chamber without returning the pressure in the vacuum sample chamber to the atmospheric pressure (normal pressure), thereby it is possible to aim at enhancing the throughput by the examination device. That is, should the pressure in the vacuum sample chamber be returned to the atmospheric pressure each time when a semiconductor wafer is introduced into or delivered from the vacuum sample chamber, a much longer time would be required until the process is restarted after the vacuum sample chamber is depressurized, which results in low through-put.

Accordingly, there have been proposed or known various transfer devices which aim at enhancing the throughput in such a way that a semiconductor wafer or the like can be efficiently introduced into or delivered from the vacuum sample chamber in a short time without returning the pressure in the vacuum sample chamber to the atmospheric pressure each time when the semiconductor wafer or the like is introduced into or delivered from the vacuum sample chamber.

Conventionally, there has been generally known a multi-jointed arm type transfer device, which is configured such that a power is transmitted from a drive source located on the atmospheric side through the intermediary of a belt and pulleys so as to extend or shrink a whole of an arm portion composed of, for example, three linked arms, which are bendably connected in series. Further, as another type of the transfer device, there has been known a flog leg type transfer device having a rotary portion which is bendable like the so-called flog leg (Refer to, for example, JP-A-9-283588, paragraph 0023, and FIGS. 1 and 4, and JP-A-2001-118905, paragraphs 0019 to 0021, FIGS. 2, 3 and 6).

Further, conventionally, there has been known a transfer device which is composed of a pivot arm which is pivotably supported, a rotary arm which is bendably supported to a distal end of the pivot arm, and a sample carrying arm which is rotatably supported in its center part to the distal end of the rotary arm, and which therefore can transfer two semiconductor wafers at one time by its carrying parts provided at opposite ends of the sample carrying arm (For example, refer to JP-A-7-142551, paragraphs 0013 to 0017, and FIGS. 1 and 2).

Further, there has been conventionally known a flog leg type transfer device having two transfer arms and configured such that two multi-jointed arm type transfer arms which are bendably formed from first to third three arm parts are arranged point-symmetric with respect to a pivot center of the pivot shaft, and a wafer carrying part for carrying a semiconductor wafer on the distal end of the third arm part is provided to transfer two semiconductor wafers at one time (Refer to for example, JP-A-7-142552, paragraphs 0014 to 0020, FIGS. 1, 3 and 7).

Further, there has been known a transfer device configured such that short intermediate arms are rotatably supported respectively to opposite ends of a single rotary arm which is rotatably supported in its center part so as to be rotated by a drive source, so as to be rotated in association with the rotation of the rotary arm, and further, sample carrying arms (setting plates) for carrying thereon semiconductor wafers while rotating in association with the rotation of the intermediate arms are rotatably supported respectively to the distal ends of both of the intermediate arms so as to transfer two semiconductor wafers at one time (Refer to, for example, JP-A-8-195427, paragraphs 0011 to 0013 and FIGS. 1 and 2).

BRIEF SUMMARY OF THE INVENTION

The conventional wafer exchange mechanism as stated above with reference to FIG. 9 has not been able to avoid a time loss caused by a step of shifting the sample stage 85 from the wafer exchange position with respect to the load lock chamber 82b to the wafer exchange position with respect to the load lock chamber 82a (the arrow D4) when the examined wafer $W_A$ on the sample stage 85 is exchanged with the unexamined wafer $W_B$.

Further, since these wafer exchange mechanisms 84a, 84b are of a multi-jointed arm type having not less than two rotary shafts, an occupying space necessary for installing and driving them becomes larger so that the load lock chambers 82a, 82b have to have a larger internal space volume.

Thus, the larger the internal space volume of the load lock chambers 82a, 82b is, the longer the waiting time by which the pressure therein is returned to a predetermined vacuum condition from a atmospherically opened condition is.

Accordingly, in the conventional technology, there has been possibly caused such a case that the preparation of the next unexamined wafer $W_B$ is not completed until the examination of the wafer $W_A$ in the load chamber 81 is completed. Further, since the two load chambers 82a, 82b are provided, it requires two spaces where change-over between a vacuum condition and an atmospherically opened condition is always carried out. Thus, there would have been possibly caused a problem of prolonging the waiting time.

Thus, in the conventional technology, it is limited to shorten the waiting time caused by the wafer exchange, resulting in hindrance to promotion of the examination of a wafer.

Accordingly, a first object of the present invention in an aspect form is to provide an apparatus which is capable of shortening a time required for exchanging wafers in a charged particle beam equipment for examining or measuring a semiconductor wafer so as to enhance throughput during the examination of wafers, thereby, contributing to rapid examination of a wafer.

In order to achieve the first object of the present invention, there is provided an electron microscope as the charged particle beam equipment according to the present invention, comprising a sample chamber having a first internal space in which a focused beam is irradiated onto a wafer in a vacuum condition, a sample stage for shifting the wafer in the first internal space, a load lock chamber having a second internal space in which a vacuum condition and an atmospherically opened condition are changed over therebetween, a wafer exchange portion for exchanging a wafer on the sample stage with another one, a gate valve for communicating and isolating between the first and second internal spaces, through which the wafers to be exchanged pass, wherein the wafer exchange portion comprises a first arm which slides in its longitudinal direction so as to reciprocate between the first internal space and the second internal space, a first wafer gripping part provided to the distal end of the first arm, for gripping and releasing the wafer on the sample stage, a second arm which slides in its longitudinal direction so as to reciprocate between the first internal space and the second internal space, and a second wafer gripping part provided to the distal end of the second arm, for gripping and releasing the wafer on the sample stage.

With this configuration, the first arm and the second arm may carry out both withdrawal of an examined wafer from the sample stage and setting of an unexamined wafer thereon at one wafer exchange position, substantially simultaneously. Accordingly, the provision of only one load lock chamber is required, thereby it is not necessary to shift the sample stage during exchange of wafers, as experienced by the conventional configuration, and also it is possible to use only one space where a vacuum condition and an atmospherically opened condition are changed over therebetween. Further, since the first arm and the second arm slide in the longitudinal direction, the second internal space of the load chamber which is required for installing and driving these two arms may be decreased.

In view of the above-mentioned configuration, the charged particle beam equipment for examining and measuring a semiconductor wafer, may shorten a time required for settling the load lock chamber which has been opened to the atmosphere to a predetermined vacuum condition. Further, the shifting distance of the sample stage may be reduced. Thus, the waiting time required for exchanging wafers in the charged particle beam equipment may be further shortened so as to enhance the throughput during the examination of the wafers, thereby it is possible to promote the examination of the wafers.

Further, in the transfer device disclosed in JP-A-7-142551, it is required to turn the sample carrying arm around its center as a fulcrum by an angle of 180 deg., in order to exchange the examined wafer with the unexamined wafer after the rotary arm is retracted so as to be overlapped with the pivot arm. Accordingly, the auxiliary exhaust chamber of the semiconductor examination apparatus in which the transfer device is incorporated has to have an occupying area corresponding to a rotating radius of the sample carrying arm, and accordingly, the auxiliary exhaust chamber must have a correspondingly larger size.

Further, during exchange operation, after the unexamined wafer is set on a sample carrying part at one end of the sample carrying arm, the pivot arm is turned by a predetermined angle so as to direct an empty sample carrying part at the other end of the sample carrying arm toward the vacuum sample chamber. In this condition, the rotary arm is rotated and extended from the pivot arm in order to introduce the empty sample carrying part at the other end of the sample carrying arm into the vacuum sample chamber for accessing the examined wafer which is therefore received by the sample carrying part at the other end.

Thereafter, the rotary arm is rotated and retracted so as to be superposed with the pivot arm, thereby retracting (move back) the sample carrying arm from the vacuum sample chamber to the auxiliary exhaust chamber, where the sample carrying arm is turned by an angle of 180 deg. so as to direct the sample carrying part of the sample carrying arm which carries thereon the unexamined wafer, at the one end of the sample carrying arm, toward the vacuum sample chamber. In this condition, the rotary arm should be again rotated and extended from the pivot arm so as to introduce the unexamined wafer into the vacuum sample chamber. That is, there are required two rotating steps of rotating and retracting the rotary arm from the pivot arm, and rotating the sample carrying arm solely by an angle of 180 deg.

Thus, the transfer device disclosed in JP-A-7-142551 requires the auxiliary exhaust chamber having an occupying area corresponding to the turning radius of the sample carrying arm, and accordingly, the auxiliary exhaust time is prolonged, and further, a long time is required for exchange operation between the examined wafer and the unexamined wafer. Thus, the transfer device disclosed in JP-A-7-142551 is not always excellent in improvement of throughput.

Further, since three drive sources for pivoting, extending-retracting and rotation, and respective power transmissions are required, resulting in a problem of a complicated structure.

Further, a transfer device having two transfer arms disclosed in JP-A-7-142552 requires two transfer arms which are formed in a substantially similar way, and accordingly, its structure is complicated while the device itself become larger, resulting in the necessity of an auxiliary exhaust chamber having a large occupying area. Thus, the volume of the auxiliary chamber is increased, and accordingly, a long time is taken for auxiliary exhaust.

Further, after the examined wafer is received by one of the transfer arms from the vacuum sample chamber, there are required two steps of operation, that is, retracting the one of the transfer arms into the auxiliary chamber, and rotating the entire device by an angle of 180 deg., and as a result, a long time is required for exchange between the examined wafer and the unexamined wafer. Thus, it is not always excellent in enhancement of the throughput.

Further, the transfer device disclosed in JP-A-8-195427 can carry out take-up and -out of the examined wafer from the vacuum sample chamber and introduction of the unexamined chamber into the vacuum sample chamber through a series of normal and reverse rotating motions of the rotary arm during exchange operation, and accordingly, the time required for the exchange of the wafers can be shorter than those disclosed in JP-A-7-142551 and in JP-A-142552. However, there would be caused such a risk that deviation occurs in the rotation of the intermediate arm associated with the rotation of the rotary arm and in the rotation of the sample carrying arm associated with the rotation of the intermediate arm.

That is, the rotating power for the sample carrying arm is transmitted from the rotary arm which is directly rotated by a power from the drive source through the rotation of the intermediate arm.

Thus, should a power transmission mechanism (composed of pulleys respectively provided in both rotary parts and an endless belt wound on and stretched between both pulleys) spanning from the rotary part of the intermediate arm to the rotary part of the sample carrying arm in order to transmit the rotation of the intermediate arm to the sample carrying arm be inferior to power transmission due to slipping or the like, the rotation of the rotary arm could not be precisely transmitted to the sample carrying arm by way of the intermediate arm, resulting in deviation in the rotation of the sample carrying arm.

For example, even though the rotary arm is turned in such a direction that one of the sample carrying arms is turned and introduced into the vacuum sample chamber in order to receive the examined wafer, there would be caused a risk that a failure occurs due to inferior transmission such that the sample carrying arm cannot be precisely turned and introduced to a position where it can receive the examined wafer in association with the rotation of the intermediate arm. Thus, it cannot be necessarily said that the transfer devise disclosed in JP-A-8-195427 is excellent in view of its reliability.

The present invention is devised in view of the above-mentioned problems in order to effectively solve thereof, and, the second object of the present invention is to provide a vacuum conveying apparatus, or vacuum transfer apparatus with a simple configuration, which can exchange samples in a short time so as to enhance the throughput, and which can reduce an occupying area so as to save a footprint, and to provide a charged particle beam examination equipment having the same. Further, the second object of the present invention is to provide a vacuum conveying apparatus or vacuum transfer apparatus which can prevent occurrence of contaminations such as dust and dirt in an auxiliary exhaust chamber, and a charged particle beam examination equipment with the same.

In order to achieve the above-mentioned second object, according to the present invention, there is provided a vacuum transfer apparatus comprising two drive sources provided respectively for rotation and vertical motions, an arm which is supported so as to be rotatable and vertically movable by these two drive sources, a first hand rotatably supported to one end of the arm and rotated in association with the rotation of the arm, for carrying a sample, a second hand rotatably supported to the other end of the arm, and rotated in association with the rotation of the arm, for carrying a sample, and a power transmission mechanism for transmitting the rotation of the arm to each of rotary parts of the first and second hands, and the first and second hands are supported as being spaced from each other in a vertical direction.

In order to achieve the above-mentioned second object, according to the present invention, there is provided a charged particle beam examination equipment comprising a charged particle beam optical system which has a function capable of irradiating a charged particle beam, deflecting the charged particle beam and irradiating it onto a sample, a secondary particle detector for detecting secondary particles produced by the irradiation of the charged particle beam, a vacuum sample chamber into which the sample is introduced, an auxiliary exhaust chamber provided adjacent to the vacuum sample chamber so as to introduce and deliver the sample into and from the vacuum sample chamber, and a sample stage carrying thereon the sample within the vacuum sample chamber, for displacing the sample to a specific position, and the above-mentioned vacuum transfer apparatus is furnter provided in the vacuum sample chamber in order to transfer the sample between the auxiliary exhaust chamber and the vacuum sample chamber.

In an embodiment form of the present invention, by only two controls for rotation and vertical motion of the arm to which the first hand and the second hand are supported, for example, both delivery of an examined wafer and introduction of an unexamined wafer may be simultaneously carried out, thereby it is possible to greatly shorten a transfer time including times for introduction and delivery of the sample, and exchange between samples. Thereby it is possible to aim at enhancing the throughput and simplifying the structure thereof.

Further, in an embodiment form of the present invention, the auxiliary exhaust chamber has a volume which can be restrained to such a size that a sample such as a semiconductor wafer or the like can be accommodated therein and which can transfer the sample, thereby it is possible to allow the auxiliary exhaust chamber to have a volume which is necessary but minimum. Thus, the footprint saving can be made while the time of exhaustion from the auxiliary exhaust chamber can be greatly shortened. Further, since no elevation drive portion is present in the auxiliary exhaust chamber, it is possible to restrain occurrence of foreign matter such as dust and dirt which cause contamination.

Other objects, features and advantages of the invention will become apparent from the following description of the embodiments of the invention taken in conjunction with the accompanying drawings.

BRIEF DESCRIPTION OF THE SEVERAL VIEWS OF DRAWING

FIGS. 5A and 5B are perspective views for explaining operating modes of the wafer exchange portion used in the embodiment;

Figure 1:
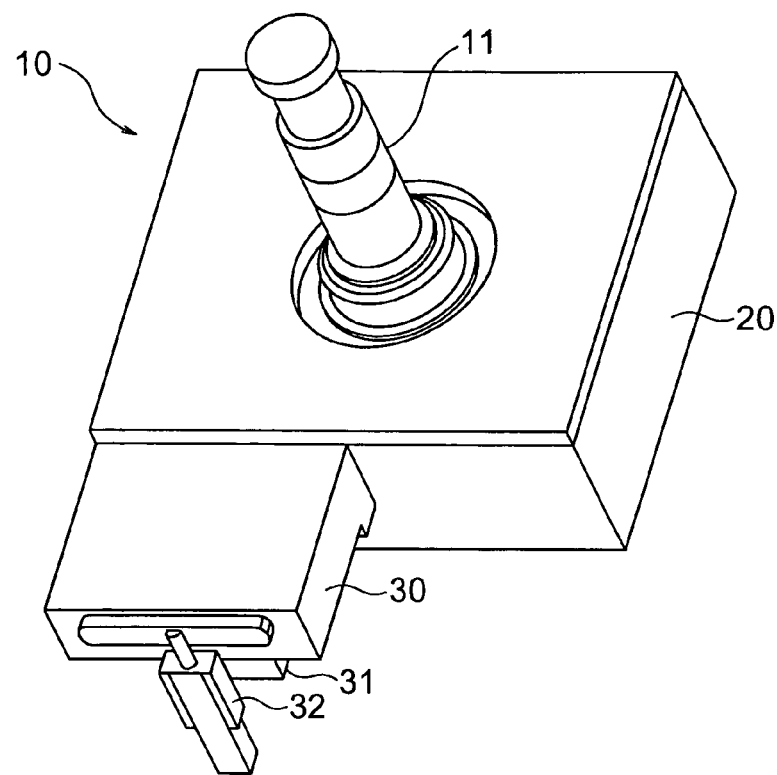
FIG. 1 is a perspective general view illustrating an external appearance of an electron microscope according to an embodiment of the present invention.
Figure 2:
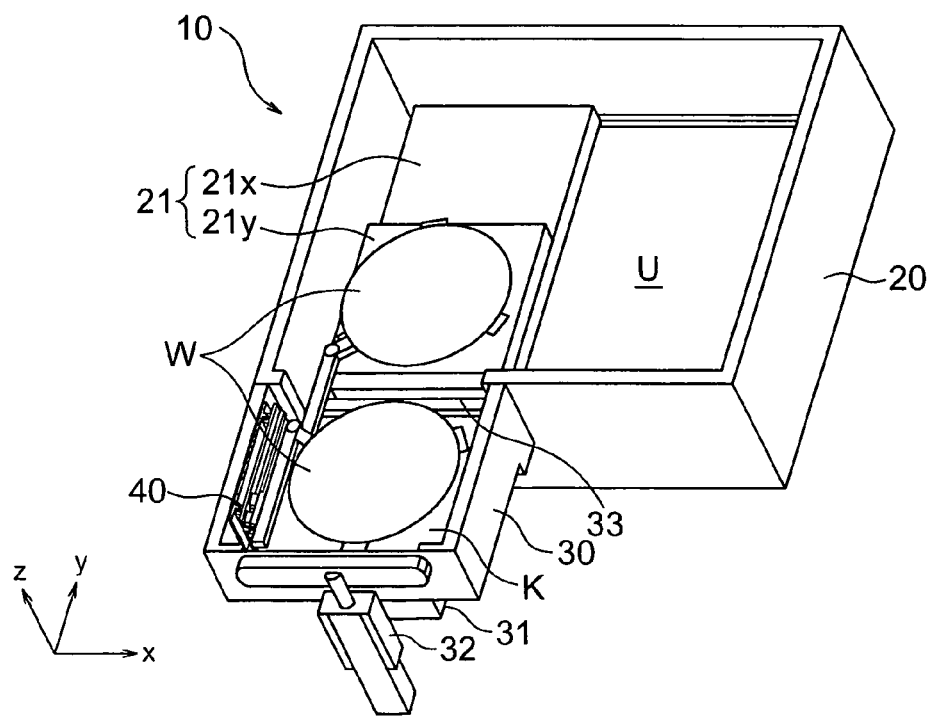
FIG. 2 is a horizontally sectional view illustrating an internal structure of the electron microscope according to the embodiment of the invention.
Figure 4A:
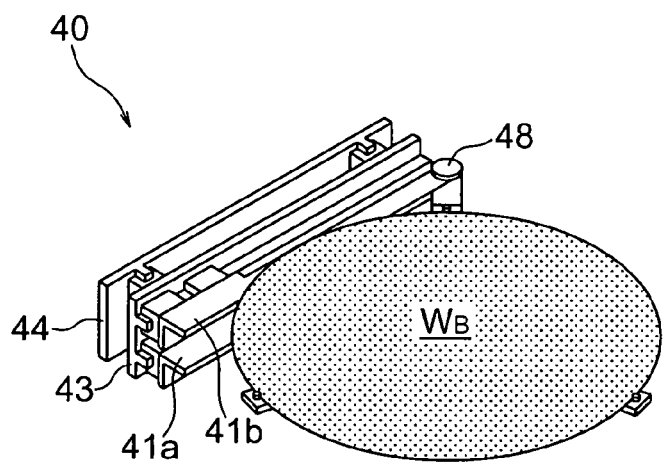
FIGS. 4A and 4B are perspective views for explaining operating modes of the wafer exchange portion used in the embodiment.
Figure 4B:
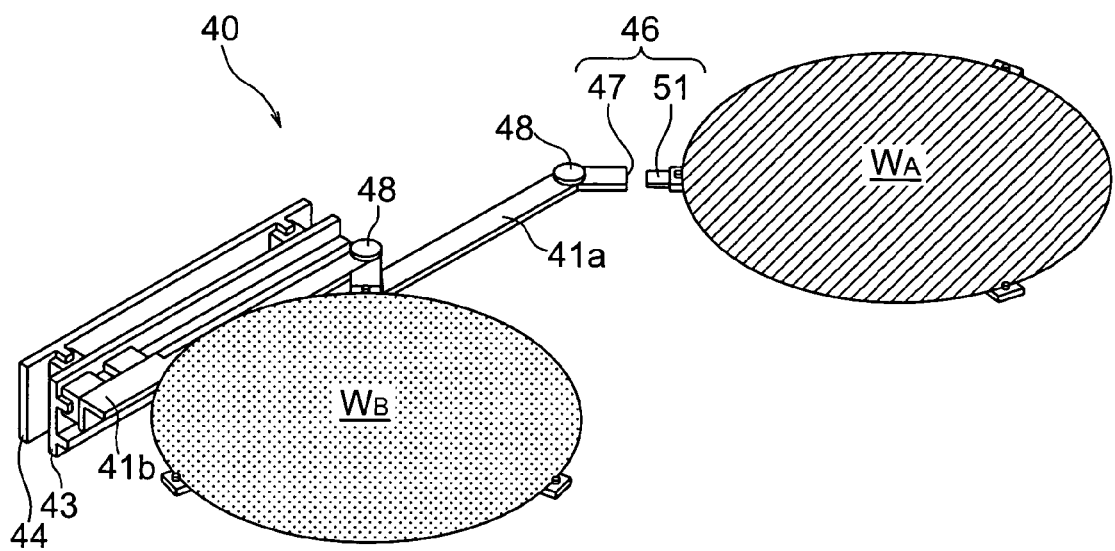
Figure 9:
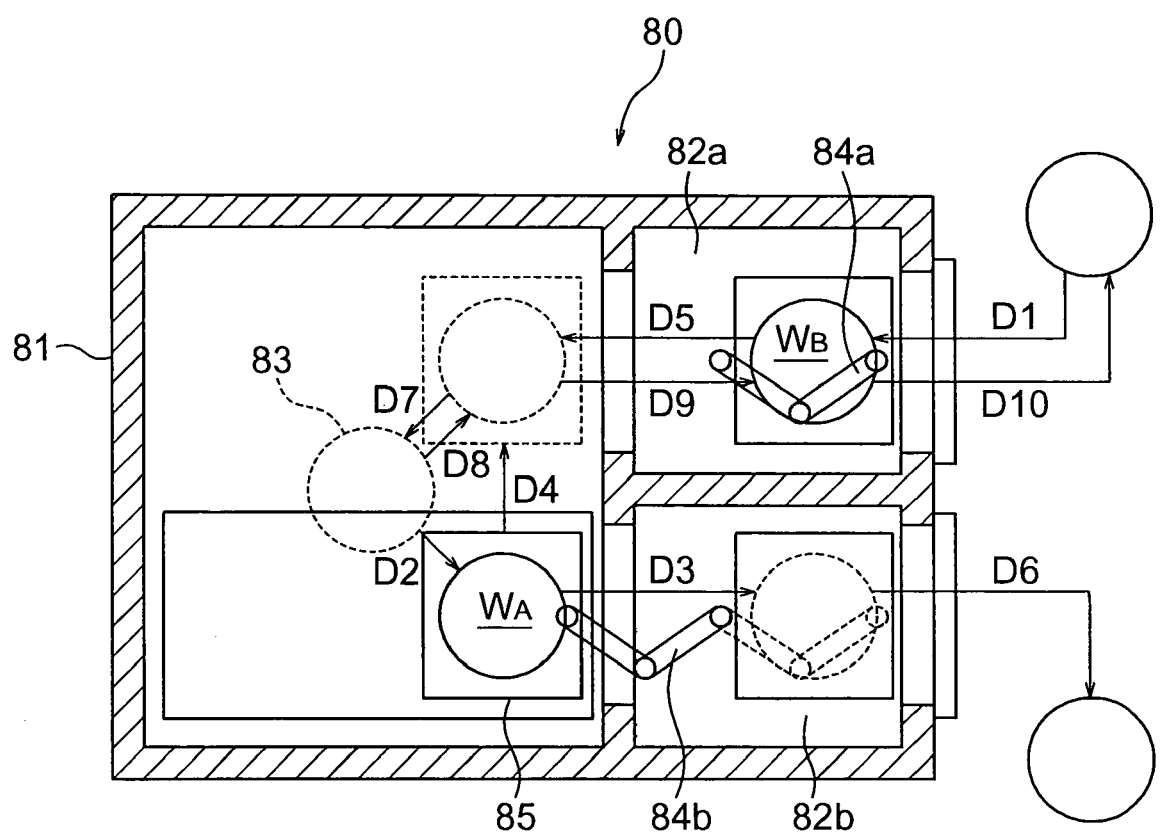
Figure 10:
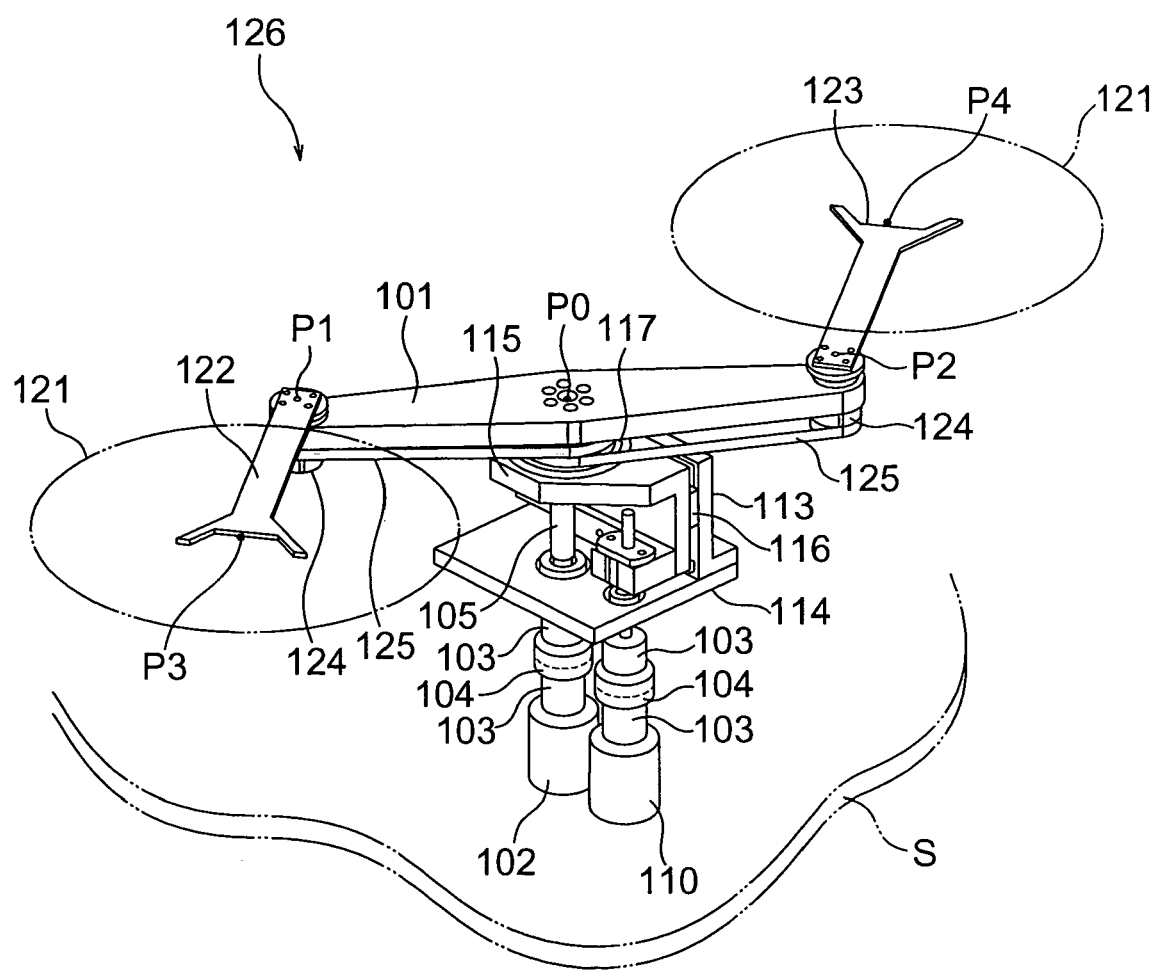
Figure 11:
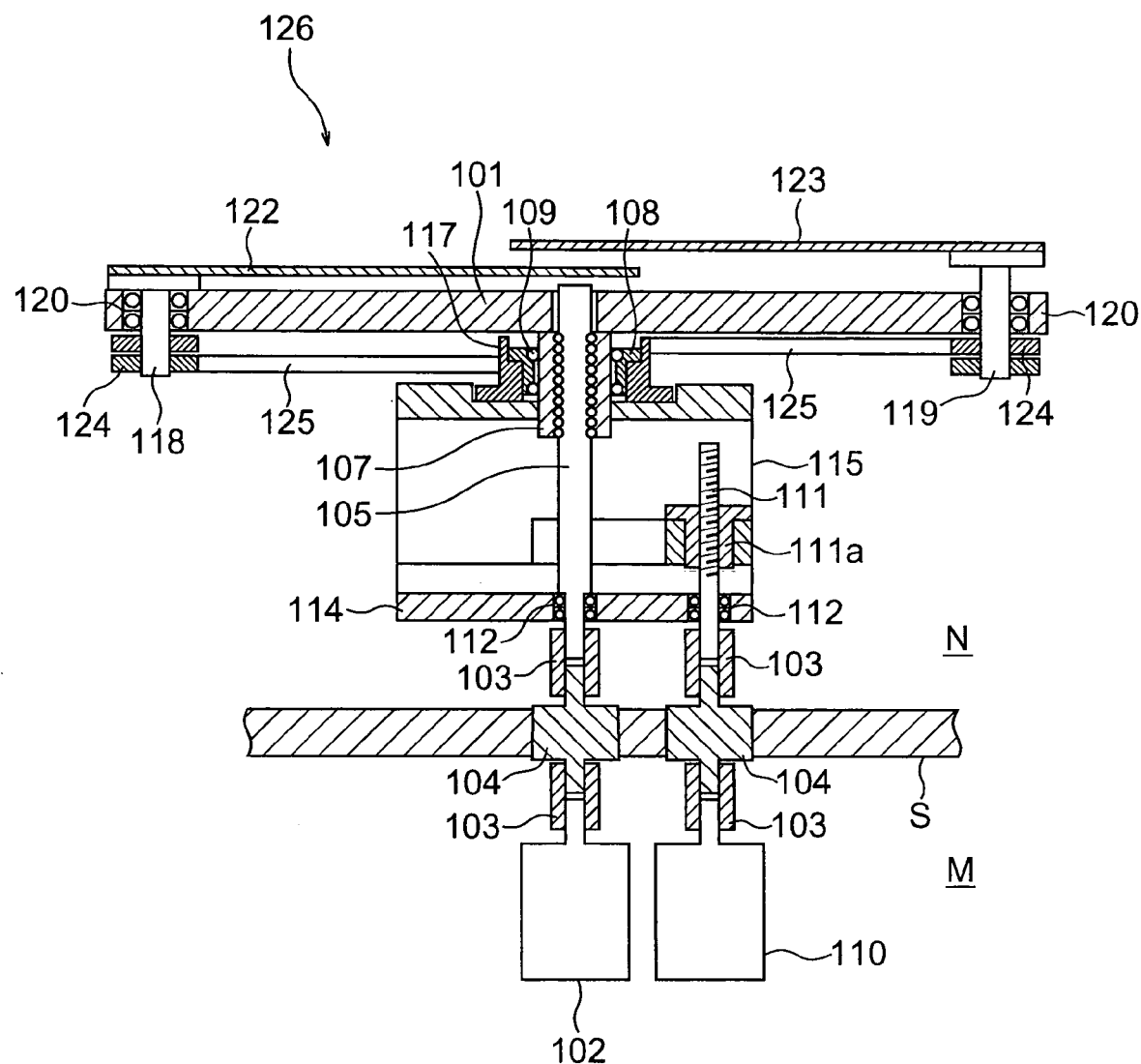
Figure 12:
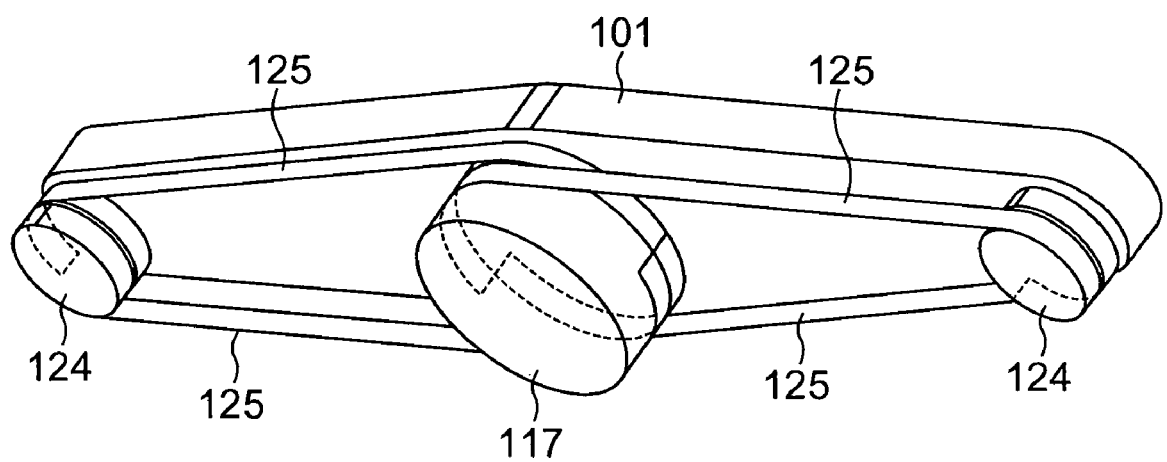
Figure 14:
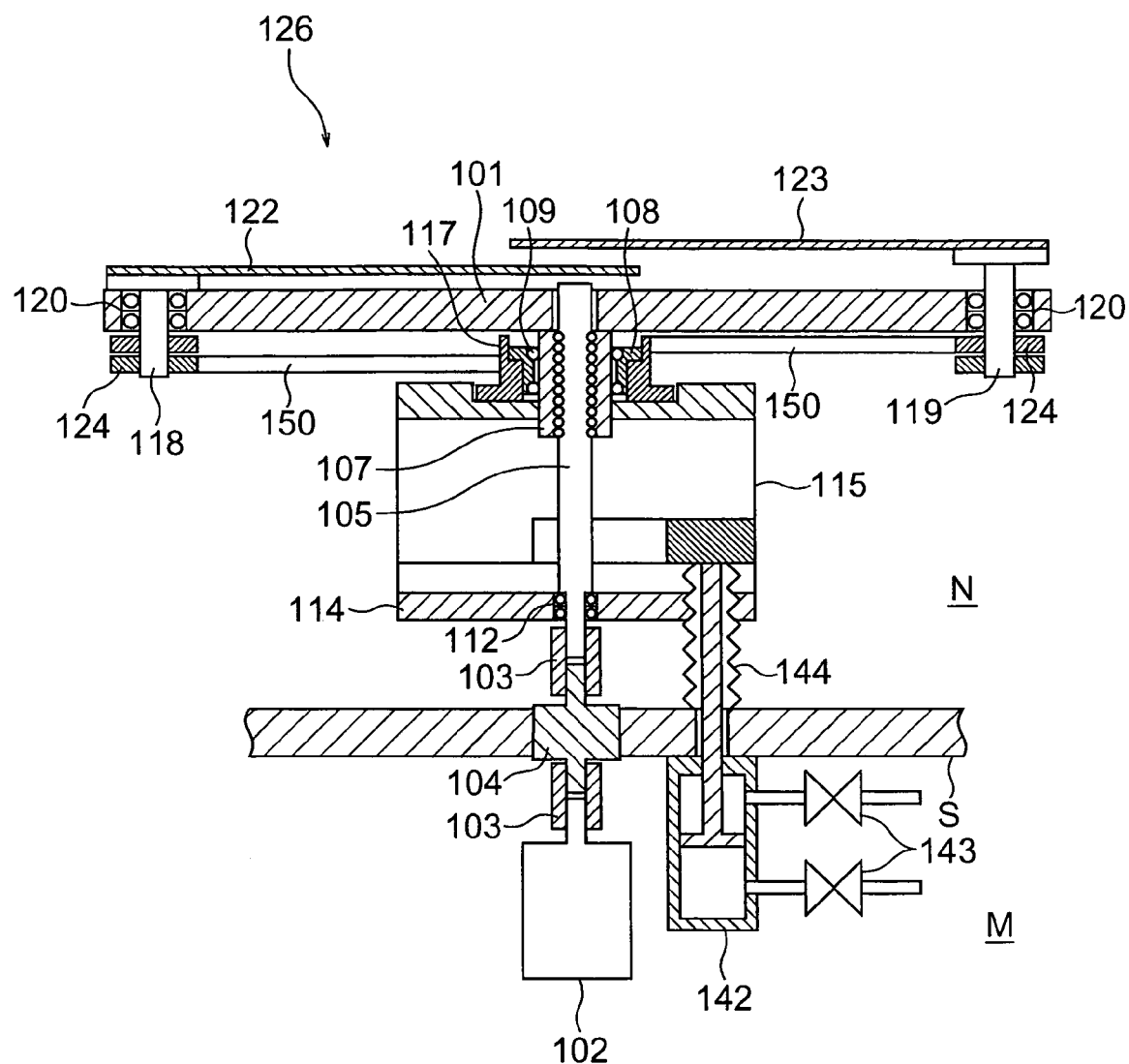
Figure 15:
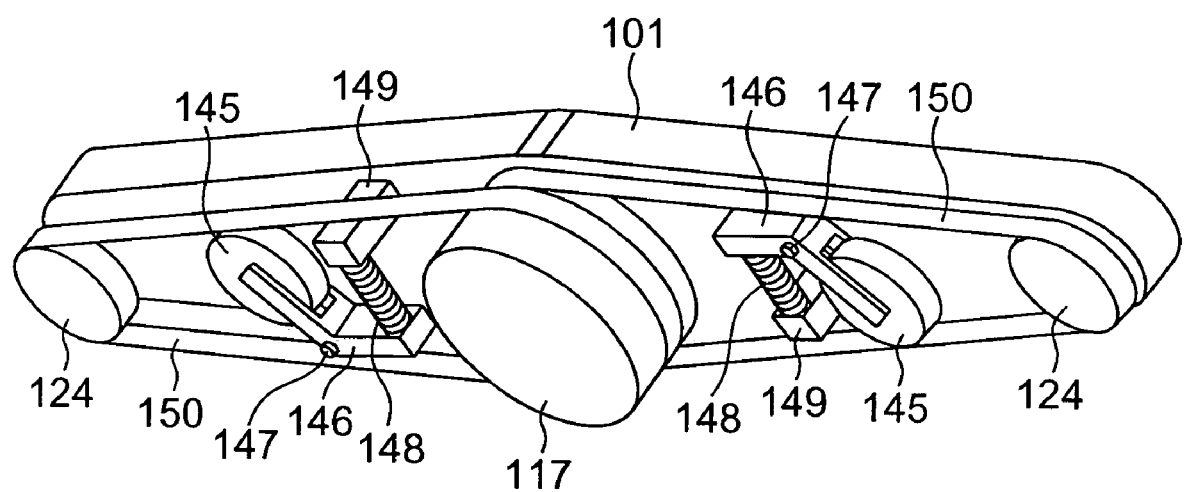
Figure 16:
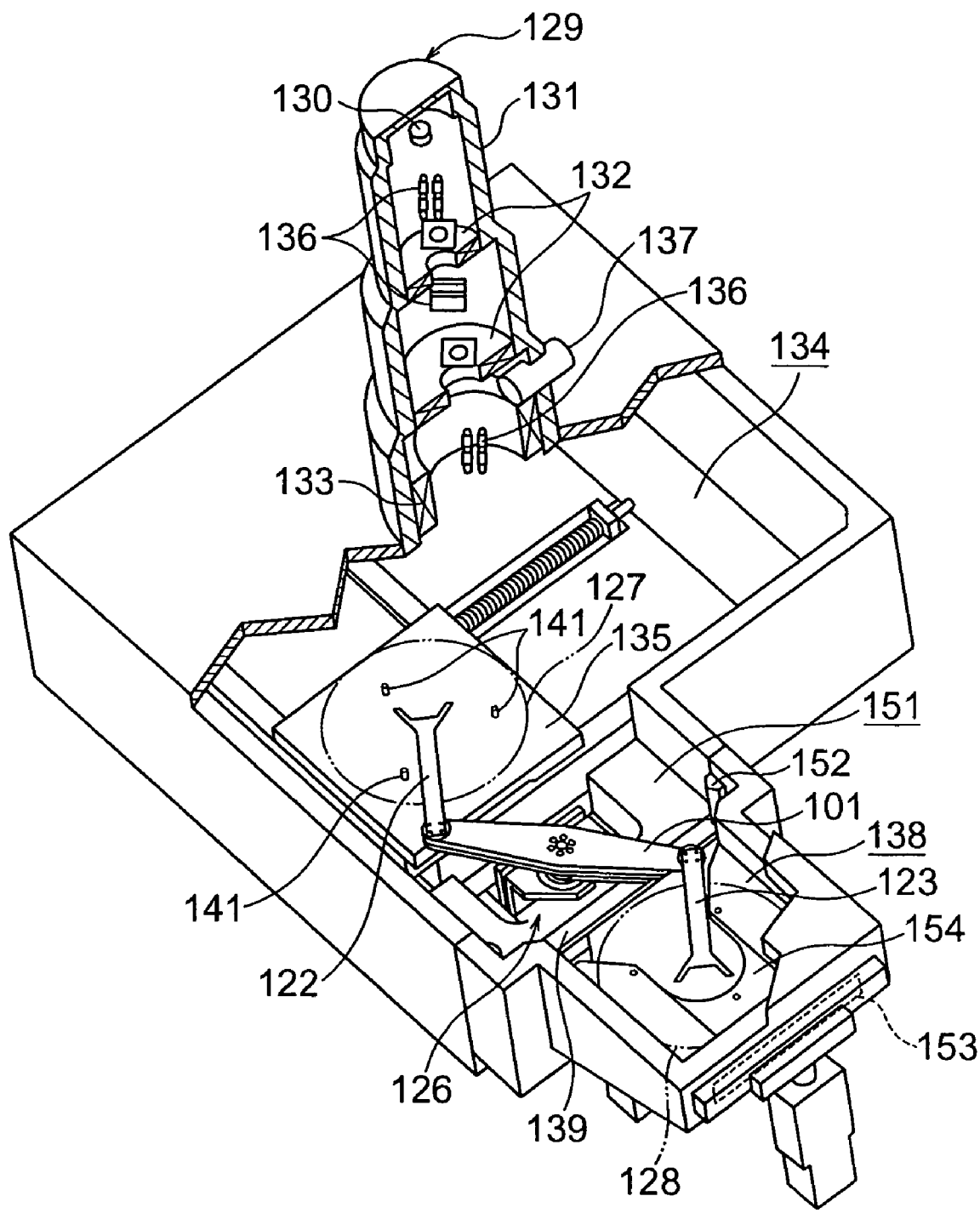
Figure 17:
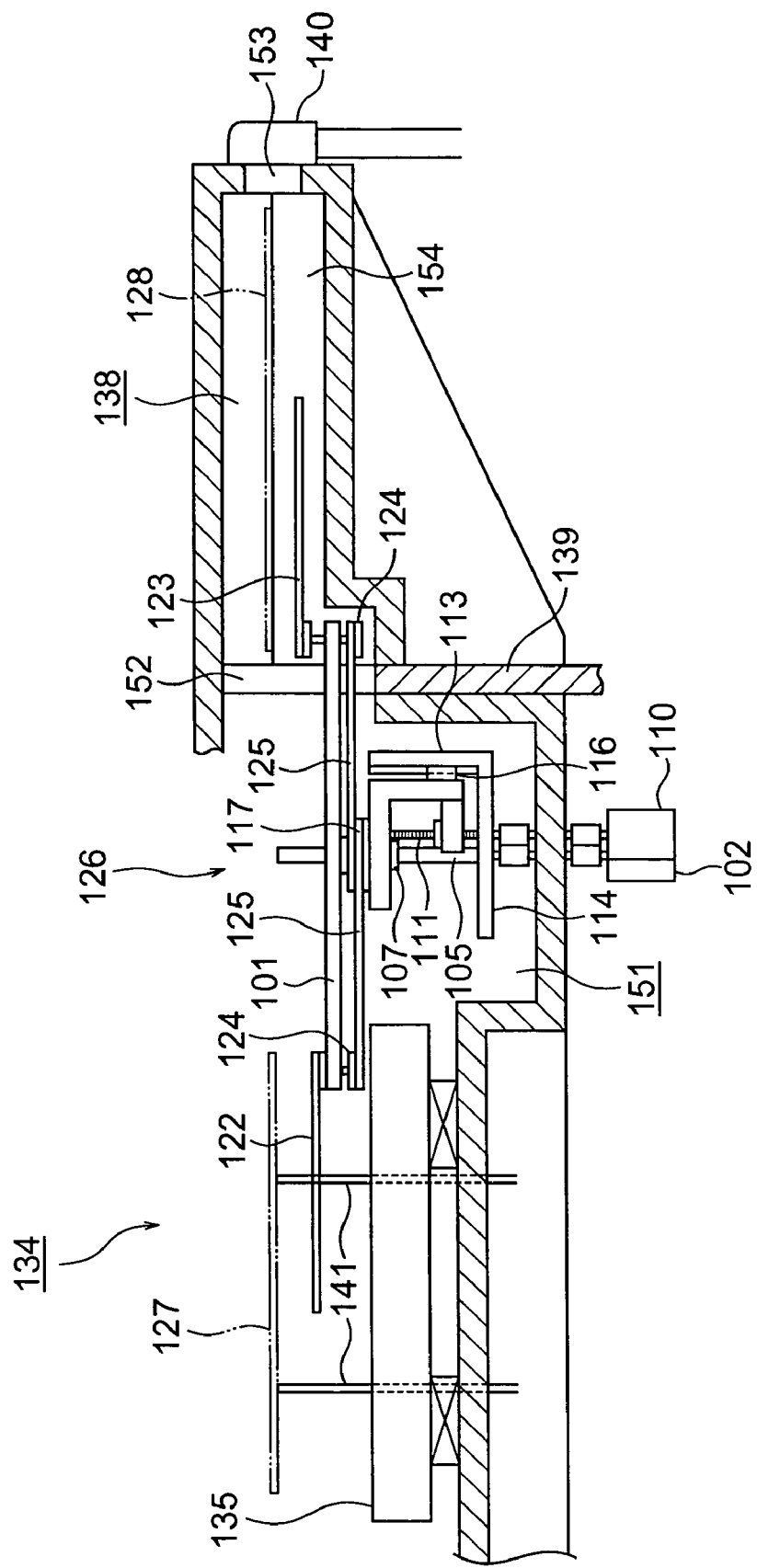
Figure 18:
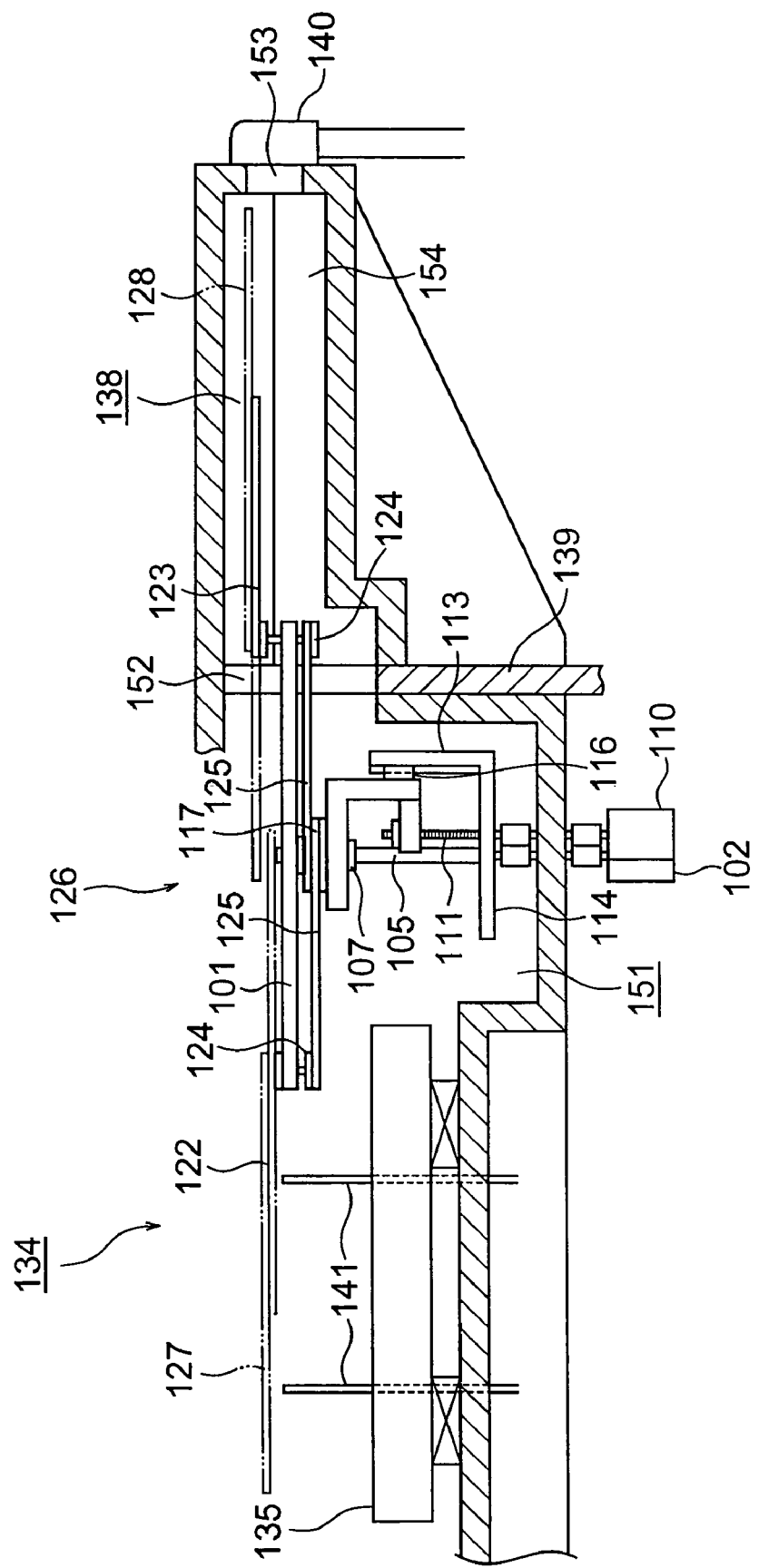

FIGS. 7A1 to 7F1 are side views for explaining examination steps for wafers in the embodiment, and FIGS. 7A2 to 7F2 are top views illustrating the same, among which FIG. 7A2 shows the wafer exchange portion in the mode corresponding to that shown in FIG. 4A, FIG. 7C2 shows in the mode corresponding to that shown in FIG. 4B, FIG. 7D2 shows in the mode corresponding to that shown in FIG. 5A, and FIG. 7F2 shows in the mode corresponding to that shown in FIG. 5B;

FIG. 8 is a flowchart for explaining examination steps by the electron microscope according to the embodiment of the present invention;

FIG. 9 is a horizontally sectional view illustrating a conventional electron microscope;

FIG. 10 is a perspective view illustrating an example of an embodiment of a vacuum transfer apparatus according to the present invention;

FIG. 11 is a longitudinal sectional view illustrating the vacuum transfer apparatus shown in FIG. 10;

FIG. 12 is an enlarged perspective view illustrating an essential part of an embodiment of a power transmission mechanism in the above vacuum transfer apparatus according to the present invention;

FIGS. 13A to 13I are views illustrating an example of operation in a wafer exchange sequence in the vacuum transfer apparatus shown in FIG. 10;

FIG. 14 is a longitudinal sectional view illustrating another embodiment of the vacuum transfer apparatus according to the present invention;

FIG. 15 is an enlarged perspective view illustrating an essential part of another embodiment of the power transmission mechanism;

FIG. 16 is a partly broken perspective view illustrating another embodiment of the power transmission mechanism according to the present invention;

FIG. 17 is an enlarged longitudinal sectional view illustrating a part of the above charged particle beam equipment in such a condition that an arm of the vacuum transfer apparatus is lowered; and FIG. 18 is an enlarged longitudinal sectional view illustrating a part of the above charged particle beam equipment in a condition in which the arm of the vacuum transfer apparatus is raised.

DETAILED DESCRIPTION OF THE INVENTION

Embodiment 1

Explanation will be hereinbelow made of embodiments of the present invention with reference to the accompanying drawings. Referring to FIG. 1, an electron microscope 10 comprises an electron optical system column 11, a sample chamber 20 and a load lock chamber 30. It is noted that explanation will be made of the electron microscope as an example of the charged particle beam equipment in this embodiment. However, the present invention should not be limited to this embodiment, that is, the present invention may also be applied to a focused ion beam apparatus (FIB) in which an ion beam is irradiated onto a sample so as to carry out processing, observing, examining, measuring or the like of the sample.

<Explanation to Electron Optical System Column>

The electron optical system column 11 is provided in a substantially center part of the upper surface of the sample chamber 20, for irradiating a focused beam toward a wafer set in the internal space of the sample chamber 20 as shown in FIG. 1.

The electron optical system column 11 includes, although not shown, an electron gun for producing an electron beam, a focusing lens for focusing the electron beam into a focused beam, a scanning means for scanning the outer surface of the wafer with the focused beam, and a secondary electron detecting means for detecting secondary electrons generated from the wafer by the irradiation of the focused beam.

<Explanation to Sample Chamber>

The sample chamber 20 is provided therein with a first internal space U defined in the sample chamber 20, a vacuum pump (which is not shown) for evacuating the internal space U, and a sample stage 21, as shown in FIG. 2. With this configuration, the sample chamber 20 in which the first internal space U has been evacuated is used for irradiating the focused beam led from the electron optical system column 11 onto the wafer W at a predetermined position.

This sample stage 21 which is composed of an X-axial direction stage $21_X$ and a Y-axial direction stage $21_Y$ displaces the wafer W to a predetermined position in the XY plane within the first internal space U so as to determine the irradiating position of the focused beam.

The X-axial direction stage $21_X$ which is provided on the bottom surface of the sample chamber 20, is adapted to be displaced only in one direction, that is, the X-axial direction shown in FIG. 2 on the bottom surface.

The Y-axial direction stage $21_Y$ which is provided on the X-axial direction stage $21_X$ is displaced only one direction, that is, the Y-axial direction shown in FIG. 2 on the X-axial direction stage $21_X$.

<Explanation to Load Lock Chamber>

The load lock chamber 30 which defines therein a second internal space K, is provided with a vacuum pump 31 for evacuating the second internal space K, an introduction/delivery gate valve 32, a partition gate valve 33 and a wafer exchange portion 40, as shown in FIG. 2.

With this configuration, the load lock chamber 30 serves to introduce therein an unexamined wafer W conveyed from an upstream process station in a semiconductor production line to the electron microscope 10, and then deliver a wafer which has been examined by the electron microscope 10 to a downstream station in the production line. Further, the unexamined wafer W introduced therein from the outside thereof temporarily stands by in the second internal space K until it is transferred into the first internal space U, and the examined wafer W transferred from the first internal space U also temporarily stands by in the second internal space K until it is delivered outside.

Further, the second internal space K in the load lock chamber 30 is set in a vacuum condition when the wafers W are exchanged between itself and the first internal space U, and is then changed over into an atmospherically opened condition when the wafer is introduced thereinto or delivered outside therefrom.

The introduction/delivery gate valve 32 can be operated to be closed when the second internal space K is set in the vacuum condition, but to be opened when it is atmospherically opened. Further, when the introduction/delivery gate valve 32 is opened, it allows an examined wafer which stands by in the second internal space K to pass therethrough in order to deliver the examined wafer outside, and also allows the unexamined wafer which has been introduced from the outside to pass therethrough in order to cause the unexamined wafer to stand by in the second internal space K.

The partition gate valve 33 which is provided at the boundary between the sample chamber 20 and the load lock chamber 30 is adapted to communicate or isolate between the first internal space U and the second internal space K in response to the opening and closing thereof. It is noted that the partition gate valve 33 is opened in a condition shown in FIG. 2.

Further, the partition gate valve 33 can be opened only when both first internal space U and second internal space K are set in the vacuum condition. Further, when the partition gate valve 33 is closed, no air cannot enter into the first internal space U in a vacuum condition even though the second internal space K is atmospherically opened. The opening of the partition gate valve 33 has a size which allows the wafers to be exchanged, to pass therethrough.

<Explanation to Wafer Exchange Portion>

Figure 3:
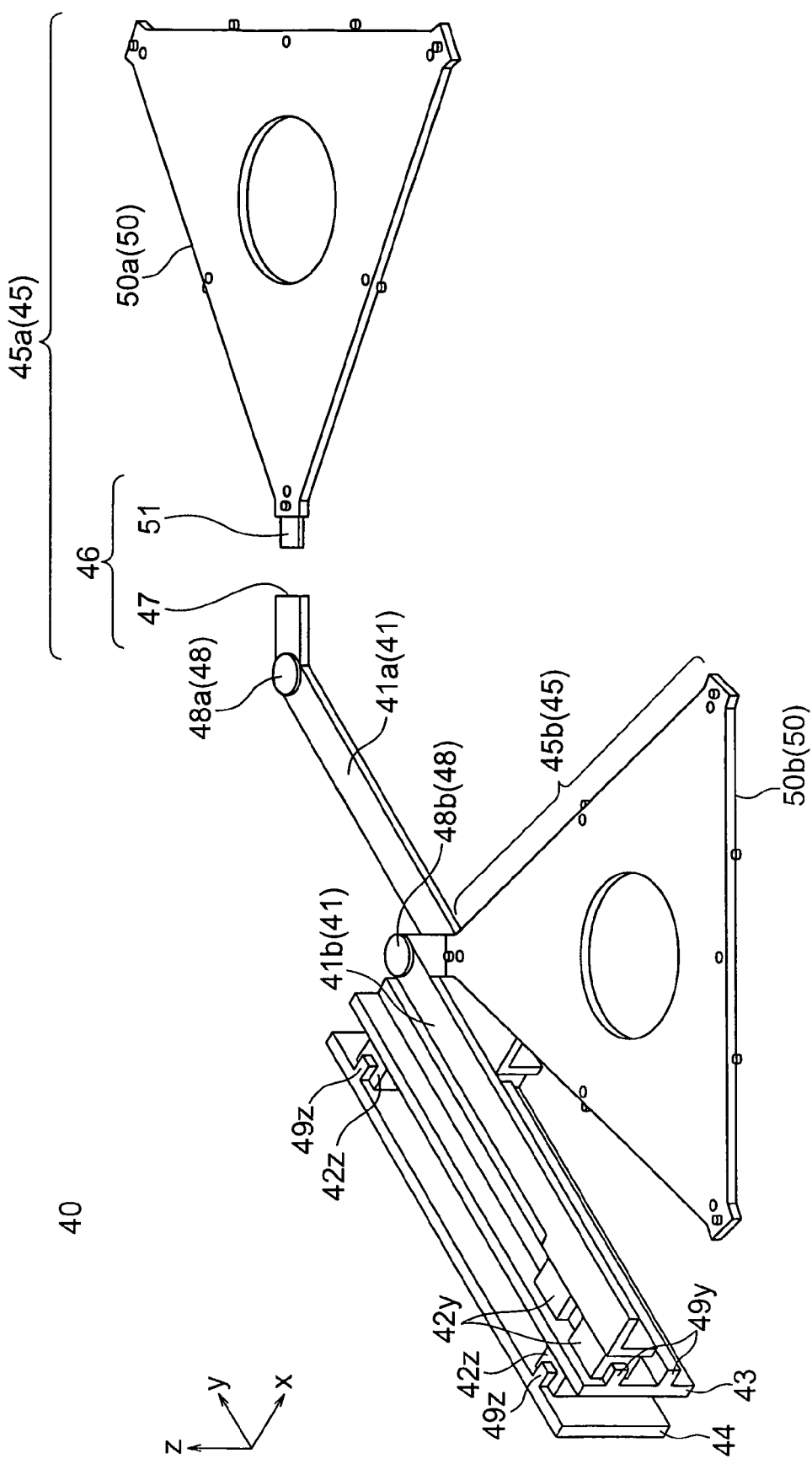
FIG. 3 is an enlarged perspective general view illustrating a wafer exchange portion used in the embodiment.

The wafer exchange portion 40 includes, as shown in FIG. 3, a first arm 41a, a second arm 41b, a first slide base 43, a second slide base 44, a wafer gripping part 45 (a first wafer gripping part 45a and a second wafer gripping part 45b).

With this configuration, the wafer exchange portion 40 repeats motions as shown in FIGS. 4A, 4B, 5A, 5B so as to exchange the examined wafer $W_A$ on the sample stage 21 (Refer to FIG. 2) with the unexamined wafer $W_B$. Further, it causes the withdrawn examined wafer $W_A$ to stand by in the second internal space K of the load lock chamber 30 (Refer to FIG. 2).

It is noted that although the wafer exchange portion 40 in FIG. 2 is provided in the second internal space K of the load lock chamber 30, the present invention should not be limited to this configuration, that is, it may be provided in the first internal space U of the vacuum sample chamber 20.

The first arm 41a and the second arm 41b (which will be hereinbelow referred simply to "arm 41" as it is appropriate) slide longitudinally, as shown in FIG. 3, so as to reciprocate between the first internal space U (Refer to FIG. 2) and the second internal space K. Further, the arm 41 is adapted to bring the wafer W (the examined wafer $W_A$ or the unexamined wafer $W_B$) gripped by the first wafer gripping part 45a (or the second wafer gripping part 45b which will be hereinbelow referred simply to "wafer gripping part 45) to a position right above the sample stage 21 (Refer to FIG. 2) or to store the same into the second internal space K in the load lock chamber 30.

The first arm 41a and the second arm 41b are provided respectively thereto with joint parts 48 (joint parts 48a, 48b) so as to flex the first arm 41a in their intermediate parts as shown in FIG. 3. Through the rotating motion of these joint parts 48, the first arm 41a and the second arm 41b may be bent by an arbitrary angle. As shown in FIG. 4A, if the joint parts 48 are set in an acutely bent condition after the first arm 41a or the second arm 41b is retracted, the wafer exchange portion 40 and the wafer W (the examined wafer $W_A$ or the unexamined wafer $W_B$) being in combination are stored in the second internal space K of the load lock chamber 30 (Refer to FIG. 2) in a space saving manner.

Further, with such motion of the joint parts 48, a long stroke length may be taken from the load lock chamber 30 to the sample stage 21 with small slide displacements of the first arm 41a or the second arm 41b.

Further, the first slide base 43 is adapted to slide each of the first arm 41a and the second arm 41b as shown in FIG. 3, independent from each other, in the longitudinal direction (in the Y-axial direction in the drawing). This slide motion is realized by an arm guide 42y provided to the arm 41, which slides along a rail 49y provided to the first slide base 43.

The second slide base 44 is adapted to slide the first slide base 43 in the vertical direction (Z-axial direction in the drawing). This slide motion is realized by a base guide 42z provided to the first slide base 43, which slides along a rail 49z provided to the second slide base 44.

Thus, the distal end of the arm 41 may be brought to a position above the sample stage 21 (Refer to FIG. 2) or is moved to and from the sample stage 21 by vertically and horizontally moving the first slide base 43 and the second slide base 44.

Thus, the wafer exchange portion 40 has such a configuration that the two arms 41 (the first arm 41a and the second arm 41b) for holding the wafers W are arranged up and down with respect to each other, and are moved, independent from each other, being crossing each other. With this configuration, when the unexamined wafer $W_B$ set on the sample stage 21 is exchanged with the examined wafer $W_A$, they may be moved simultaneously. Further, when the examined wafer W is delivered outside from the load lock chamber 30, or when the unexamined wafer W is introduced into the load lock chamber 30 from the outside thereof, the motion for the introduction and the delivery thereof may be continuously made.

Further, the opening of the partition gate valve 33 (Refer to FIG. 2) may be decreased, and further, the internal volume of the second internal space K of the load lock chamber 30 may be decreased. The smaller the internal volume of the second internal space K is, the shorter the time for returning a predetermined vacuum condition from the atmospherically opened condition is.

<Explanation to Wafer Gripping Part>

The wafer gripping part 45 (the first wafer gripping part 45a and the second wafer gripping part 45b) includes a disconnectable part 46 and a wafer holder 50 (50a, 50b), as shown in FIG. 3.

With the above-mentioned configuration, the wafer gripping part 45 is provided to the distal end of the arm 41 (41a, 41b) so as to grip and release the wafer W on the sample stage 21 (Refer to FIG. 2) which is located at the wafer exchange position. Further, the wafer gripping part 45 is adapted to temporarily stand by in the second internal space K of the load lock chamber 30 (Refer to FIG. 2) with gripping the wafer W as understood from the second wafer gripping part 45b shown in FIG. 3.

In the disconnectable mechanism 46, as shown in FIG. 3, a holder holding piece 51 provided to the wafer holder 50, and a holder hole 47 formed in the distal end part of each of the first arm 41a and the second arm 41b, are disconnectably coupled to each other. When the holder holding piece 51 is inserted into the holding hole 47, both are fitted together, and accordingly, the wafer W (and the wafer gripping part 45) is held at the distal end of the arm 41. If the wafer holder 50 is moved in a direction reverse to the direction of the insertion, the wafer holder 50 may be disconnected from the arm 41.

It is noted that the configuration of the disconnectable mechanism 46 should not be limited to that shown in the drawings, but any of those which can disconnectably hold the wafer holder 50 to the distal end of the arm 41 may be used.

Figure 6:
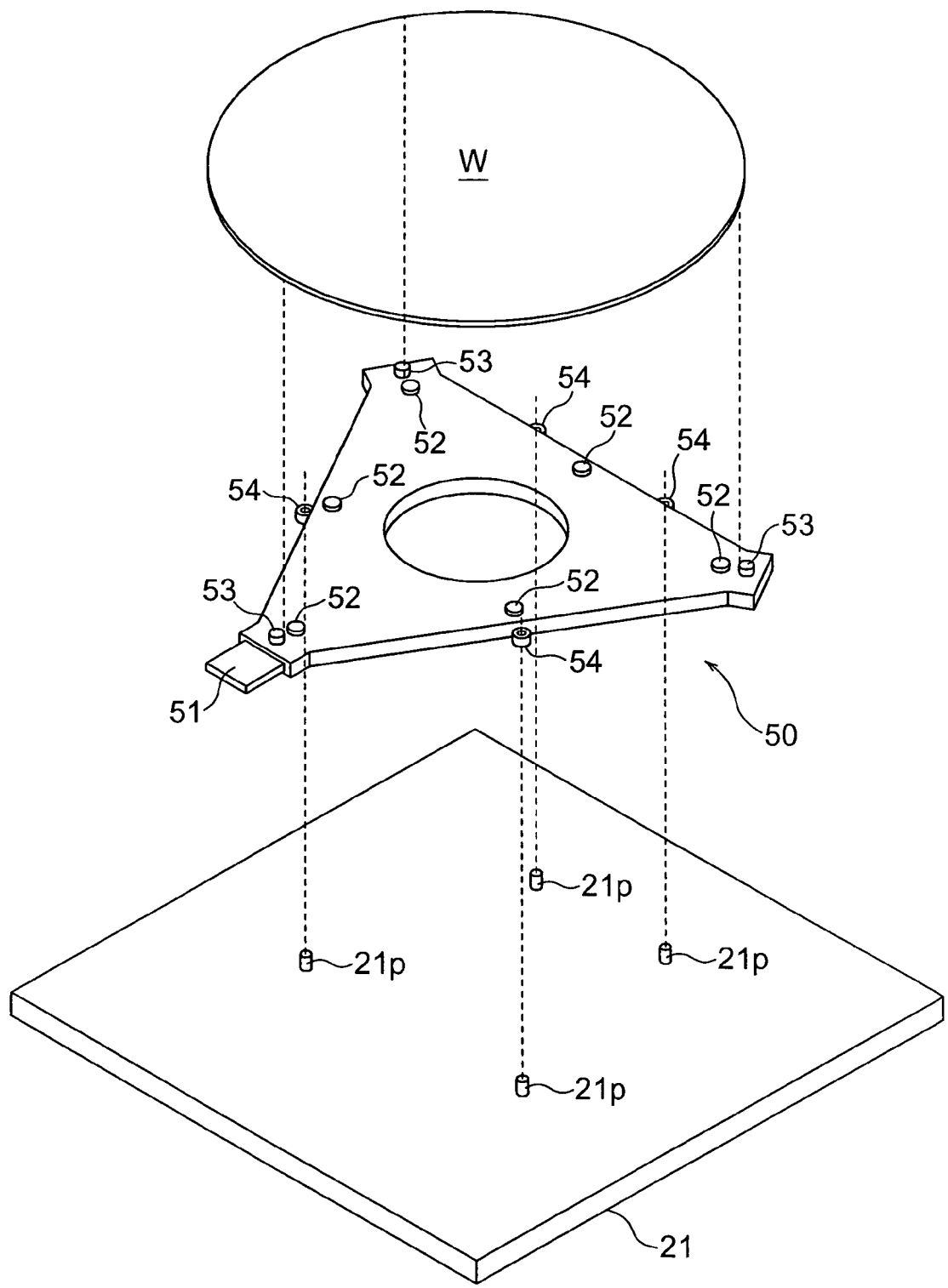
FIG. 6 is an enlarged perspective view illustrating a wafer holder used in the embodiment.

Referring to FIG. 6, the wafer holder 50 (50a, 50b) includes support seats 52, 52, . . . , a wafer fixing pins 53, 53, 53 and a holder fixing guides 54, 54, . . . , With this configuration, the wafer holder 50 carries the wafer W on its upper surface, and is fixed to the sample stage 21 at its bottom surface.

The support seats 52 make contact with the wafer W so as to support the wafer W when the waver W is set on the waver holder 50.

The wafer fixing pins 53 are located so as to make contact with the outer periphery of the wafer W at the side surface in order to fix a position of the wafer W with respect to the wafer holder 50. Further, the wafer fixing pins 53 allow the wafer W to be set away therefrom or therein by vertically moving the wafer W, but secures the wafer W so as to prevent the same from being horizontally slipped.

The holder fixing guides 54 are adapted to be fitted on holder fixing pins 21p provided on the sample stage 21 so as to secure the wafer holder 50 to the sample stage 21. Further, the holder fixing guides 54 allow the wafer holder 50 to be set away from and on the sample stage 21 by vertically moving the wafer holder 50, but fix the wafer holder 50 so as to prevent the same from being horizontally slipped.

Further, in such a condition that the holder fixing guides 54 are fitted on the holder fixing pins 21p, when the sample stage 21 is moved, the holding piece 51 and holding hole 47 in the disconnectable mechanism 46 are released from its fixed condition, and accordingly, the wafer W ($W_B$) is released from its fastened condition in the wafer exchange portion 40, as shown in FIG. 5A.

Thus, even in such a case that a plurality of wafers W having different diameters are handled during examination, the wafer gripping part 45 which utilizes a holder exchange system using the wafer holder 50, as shown in FIG. 3, can examine the wafers W with the use of the wafer holder 50 which can accept a diameter of this wafer W without exchanging components of the apparatus.

It is noted that the wafer gripping part 45 should not be limited to the configuration shown in FIG. 3, but any of those which can hold and release the wafer W at the distal end of the arm 41 (41a, 41b) may be used. That is, without using the wafer holder 50 which is set on the sample stage 21, being integral with the wafer W as shown in FIG. 6, there may be used such a type that a support member (which is not shown) is led between the wafer W and the sample stage 21 so as to directly scope up the wafer W.

<Explanation to Operation of Examination of Wafer>

Referring to FIGS. 7A1 to 7F2 and FIG. 8, explanation will be made of the operation of examination of the wafer (The other drawings will be also referred to whenever it is necessary). The explanation will be made at first of the withdrawal of the examined wafer $W_A$ from the sample stage 21 on which the wafer W is set after the examination and measurement are completed through observation by the electron microscope in such a condition that the sample stage 21 is located at a position where the focused beam is irradiated.

First, the partition gate valve 33 is opened so as to communicate the first internal space U with the second internal space K (step S11, the wording "step" will be hereinbelow omitted). It is noted that the wafer exchange portion 40 is set at this time in a condition shown in FIG. 4A.

Next, as shown in FIGS. 7B1 and 7B2, the first arm 41a is advanced to the sample chamber 20 (S12). Simultaneously, as shown in FIGS. 7C1, 7C2, the sample stage 21 is moved from the position where the focused beam is irradiated to the wafer exchange position together with the examined wafer $W_A$ (S13). Then, as shown in FIG. 4B, the holder holding piece 51 is fitted in the holding hole 47, and accordingly, the examined wafer $W_A$ is held on the first arm 41a.

Next, as sown in FIGS. 7D1, 7D2, the first arm 41a is retracted (S14) so as to shift the examined wafer $W_A$ into the load lock chamber 30, and the second arm 41b which carries thereon the unexamined wafer $W_B$ is advanced (S14b) and is thereafter displaced downward in order to set the unexamined wafer $W_B$ on the sample stage 21.

Next, as shown in FIGS. 7E1, 7E2, the sample stage 21 on which the unexamined wafer $W_B$ is set, is moved to the position where the focused beam is irradiated (S15a), resulting in the disconnection of the disconnectable mechanism 46, and accordingly, the second arm 41b is retracted (S15b).

Next, as shown in FIGS. 7F1, 7F2, the partition gate valve 33 is closed so as to isolate the first internal space U from the second internal space K (S16). Thus, even though the load lock chamber 30 is atmospherically opened (S17), the sample chamber 20 is held in a vacuum condition, and accordingly, the examination by the electron microscope can be continued through the irradiation of the focused beam onto the unexamined wafer $W_B$ (S18).

Next, the introduction/delivery gate valve 32 is opened so as to deliver the examined wafer $W_A$ set on the wafer holder 50 from the load lock chamber 30 into the outside (S19) while another unexamined wafer $W_B$ is introduced into the load lock chamber 30 from the outside, and is then set on the wafer holder 50 (S20). It is noted that the wafer exchange portion 40 at this time is in the condition shown in FIG. 5B.

Next, again in the condition shown in FIGS. 7A1, 7A2, the introduction/delivery gate valve 32 is closed, the second internal space K in the load lock chamber 30 is evacuated up to a predetermined vacuum condition (S21) for preparation of wafer exchange.

Further, whether or not the load lock chamber 30 falls in the predetermined vacuum condition, and whether or not the examination for the wafer W in the sample chamber 20 is completed are determined (S22). If both are satisfied (Yes at S22) and if another unexamined wafer $W_B$ to be next examined is present, coming back to step S11, the examination is repeated (No at S23). If no unexamined wafer $W_B$ to be next examined is present, the examined wafer $W_A$ which is at present set on the sample stage 21 is retracted into the load lock chamber 30, and is thereafter delivered outside. Thus, a series of process steps are completed (Yes at S23).

As understood from the above-mentioned process steps, according to the present invention, the examined wafer $W_A$ and the unexamined wafer $W_B$ may be simultaneously exchanged on the sample stage 21, as shown in FIGS. 7C1, 7D1, and FIG. 8 (steps S19, S20). Thus, the waiting time caused during the exchange of the wafers can be shortened. Further, according to the present invention, as shown in FIG. 8 (steps S19, S20), the examined wafer $W_A$ and the unexamined wafer $W_B$ may be continuously delivered and introduced to and from the outside, and accordingly, the waiting time for the exchange of the wafers can be shortened. Further, according to the present invention, the second internal space K of the load lock chamber 30 may be designed so as to have a small volume, the time of evacuation up to the predetermined vacuum condition as show in FIG. 8 (step S21) may be shortened, and the waiting time for the exchange of the wafers may be shortened.

Thus, the period (period for preparation of a next wafer $W_B$ to be examined) exhibited by steps (S17 to S21) in FIG. 8 may be greatly shortened, and may be possibly be prevented from exceeding a required time for the observation process by the electron microscope exhibited at step S18. Thus, the whole period shown in FIG. 8 (steps S11 to S23) may be shortened. Thereby, it is possible to aim at enhancing the throughput of wafer examination by the electron microscope, that is, the examination of wafers may be promoted.

Further, according to the present invention, since there is used such a manner that the wafer holder 50 on which the wafer W is directly set is replaced with another one, any of wafers having different sizes may be accepted with the use of the wafer holder 50 corresponding to a size of a wafer to be examined. Thus, even though wafers having different sizes are examined, no replacement of components of the sample stage is required, thereby it is possible to provide an electron microscope which can readily accept change-over between production rots.

Further, according to the present invention, since the second internal space K of the load lock chamber 30 may have a smaller volume, the installation space of the electronic microscope becomes smaller, thereby it is possible to reduce the occupying space in a clean room where a semiconductor production line is laid.

Embodiment 2

FIG. 10 is a perspective view illustrating an embodiment of a vacuum transfer apparatus according to the present invention, FIG. 11 is a schematic sectional view illustrating the vacuum transfer apparatus shown in FIG. 10, and FIG. 12 is a schematic perspective view illustrating a power transmission mechanism in the above vacuum transfer apparatus in an example form.

<Explanation to Vacuum Transfer Apparatus>

As shown in FIG. 10, the vacuum transfer apparatus 126 is provided with on the vacuum N side (Refer to FIG. 11) an arm 101 which is supported so that it can be rotated and vertically moved by two drive sources 102, 110 arranged on the atmospheric M side (Refer to FIG. 11) for rotation and vertical motions. A first hand 122 and a second hand 123 are rotatably supported respectively to opposite ends of the arm 101, and accordingly, they are rotated in association with the rotation of the arm 101 in order to carry a sample such as a semiconductor wafer 121. The rotation of the arm 101 is transmitted to each of the first hand 122 and the second hand 123 through the intermediary of a power transmission mechanism which will be detailed later, and accordingly, the first hand 122 and the second hand 123 are rotated in association with the rotation of the arm 101.

<Explanation to Rotary Drive Source for Arm>

The rotary drive source 102 is composed of, for example, a motor capable of switching between normal and reverse rotations so as to rotate the arm 101 in the clockwise and counterclockwise directions, which is located on the atmospheric M side, as shown in FIG. 11, and from which rotating power is introduced into the vacuum N side through the intermediary of a coupling 103 coaxially arranged on the atmospheric M side, and a seal 104 provided piercing through a partition wall S which isolates the vacuum N side from the atmospheric M side.

Incidentally, the seal 104 is a magnetic fluid seal including a mixture of magnetic substance and oil having a low vapor pressure, and accordingly, this seal 104 will be hereinbelow referred to as "magnetic fluid seal 104" whenever it is appropriate.

Further, as shown in FIG. 11, the rotary drive source 102 is adapted to rotate a rotary drive shaft 105 of the arm 101 which is coaxially coupled with the magnetic fluid seal 104 on the vacuum N side through the intermediary of the coupling 103. This rotary drive shaft 105 is rotatably journalled to a base plate 114 provided on the vacuum N side through the intermediary of a roller bearing 112.

Further, the rotary drive shaft 105 is supported to an arm support part 107 provided on the vacuum N side so as to be vertically movable but to be constrained from rotation (engagement). In detail, a ball spline structure is provided between the rotary drive shaft 105 and the arm support part 107, and accordingly, with this ball spline structure, supports the rotary drive shaft 105 is supported to the arm support part 107 so as to be vertically movable but to be constrained in rotation (engagement), that is, rotating power can be transmitted from the rotary drive shaft 105 to the arm support part 107.

The arm support part 107 is coupled to the arm 101 in the longitudinally center part thereof through which the rotary drive shaft 105 is slidably extended, as shown in FIG. 11, and accordingly, the rotating power is directly transmitted from the rotary drive shaft 105 to the arm 101.

Further, the arm support part 107 is coaxially provided thereto with a rotary flange 108 for transmitting rotation of the arm support part 107 to a first pulley 117 of the power transmission mechanism, which will be described later. This rotary flange 108 is supported to the arm support part 107 through the intermediary of a roller bearing 109 so as to be rotatable but to be vertically constrained (engagement) Further, the rotary flange 108 is coaxially coupled thereto with the first pulley 117.

<Explanation to Vertical Drive Source for Arm>

The vertical drive source 110 is adapted to lower the arm 101 upon rotation of the arm 101, and to repeat ascent and descent of the arm 101 upon receiving and delivery of samples such as a semiconductor wafers 121 (examined wafer 127 and unexamined wafer 128 which will be detailed later) by the first hand 122 and the second hand 123 which are rotated in association with the rotation of the arm 101.

The vertical drive source 110 which comprises a motor located on the atmospheric M side, as shown in FIG. 11, similar to the rotary drive source 102, and so on, introduces rotating power into the vacuum N side through the intermediary of a coupling 103 provided on the atmospheric M side, coaxially therewith, and a magnetic fluid seal 104 which is provided in the partition wall S isolating the vacuum N side from the atmospheric M side, being extended therethrough, and accordingly, the rotation power is transmitted to a ball screw 111 for vertically driving the arm, which is coaxially coupled.

The ball screw 111 is coaxially coupled by a coupling 103 to the magnetic fluid seal 104 on the vacuum N side, as shown in FIG. 11, and is rotatably supported to the base plate 114 through the intermediary of a roller bearing 112.

Further, as shown in FIG. 11, the ball screw 111 is coupled to a pulley base 115 which is attached to a guide base 113 attached upright to the base plate 114 through the intermediary of a direct acting guide member 116 so as to be vertically movable, by way of a flanged nut member 111a, and is accordingly adapted to vertically move the pulley base 115. That is, the rotation of the ball screw 111 is converted into vertical motion for vertically moving the pulley base 115. Thus, the arm 101 is moved upward or downward (Refer to FIGS. 17 and 18 which are described later).

<Explanation to Arm, First Hand and Second Hand>

As shown in FIG. 11, the arm 101 is coupled in its longitudinally center part to the arm support part 107 through which the arm 101 is supported to the rotary drive shaft 105 so as to be rotatable and vertically movable. Further, the first hand 122 and the second hand 123 are attached respectively to opposite ends of the arm 101 through the intermediary of roller bearings 120 so that their rotary shafts 118, 119 are rotatable but are vertically constrained.

The rotary shafts 118, 119 are attached to the arm 101 one above another, as shown in FIG. 11, and accordingly, the first hand 122 and the second hand 123 are supported (arranged) being vertically spaced by a suitable distance therebtween. The rotary shafts 118, 119 have parts downward projected from the arm 101, which are coupled respectively and coaxially with second pulleys 124 of the power transmission mechanism that will be described later, being associated with the first pulley 117 by means of belts 125 so as to be rotated in association with the rotary drive shaft 105 of the arm 101.

Thus, with such a configuration that the first hand 122 and the second hand 123 are supported to the arm 101 so as to be rotatable and to be vertically spaced from each other, the first hand 122 and the second hand 123 can be rotated in association with the rotation of the arm 101 with no interference therebetween, thereby it is possible to carry samples such as the semiconductor wafer 121 set thereon.

It is noted that the vertical space distance between the first hand 122 and the second hand 123 is preferably larger than the thickness of the semiconductor wafer 121 although it should not be specifically limited thereto.

Further, in this embodiment, the revolution ratio between the arm 101 and the first hand 122 or between the arm 101 and the second hand 123 are set to 1:2. Further, as shown in FIG. 10, the distance from the center axis PO of the rotary drive shaft 105 serving as a rotating center of the arm 101 to the center axis P1 of the rotary shaft 118 of the first hand 122 and to the center axis P2 of the rotary shaft 119 of the second hand 123 is set to be equal to the distance between the center axis P1 of the rotary shaft 118 and the center position P3 of the first hand 122 at which the sample is set, and between the center axis P2 of the rotary shaft 119 and the center position P4 of the second hand 123 at which the sample is set are set to be equal to each other.

With this configuration, the first hand 122 and the second hand 123 which can be rotated with no interference therebetween in association with the rotation of the arm 101, as described above, are rotated in association with the rotation of the arm 101, for carrying the samples such as the examined wafer 127 and the unexamined wafer 128 which are respectively set on them, along and on a straight line P passing through the rotating center of the arm 101 (the center axis PO of the rotary drive shaft 105), so as to rectilinearly carry the samples such as the examined wafer 127 and the unexamined wafer 128 which are respectively set them (Refer to FIG. 13 which will be described later).

<Explanation to Power Transmission Mechanism>

Referring to FIG. 12 which schematically shows the power transmission mechanism, opposite ends of the belts 125 made of steel or the like are secured to the first pulley 117 and the second pulleys 124, and accordingly, the second pulleys 124 are rotated in association with the rotation of the first pulley 117. The revolution ratio between the first pulley 117 and the second pulleys 124 is set to 1:2 since the first pulley 117 has a pitch diameter which is two times large as that of the second pulleys 124.

The belts 125 comprises a normal rotation side belt for transmitting the rotation of the arm 101 to the first hand 122 and the second hand 123 when the arm 101 is rotated clockwise, and a reverse rotation side belt for transmitting the rotation of the arm 101 to the first hand 123 and the second hand 123 when the arm 101 is rotated counterclockwise. The end parts of the normal rotation side belt and the reverse rotation side belt are secured to the first pulley 117 and the second pulleys 124, and accordingly, the first hand 122 and the second hand 123 are rotated in association with the rotation of the arm 101.

With this configuration, no slip is caused among the belts 125, the first pulley 117 and the second pulleys 124, and accordingly, high positional reproducibility may be enhanced.

It is noted that another linkage means such as a wire which is not shown may be used instead of the belts 125 so as to transmit the rotation of the first pulley 117 to the second pulleys 124.

<Explanation to Operation of Vacuum Transfer Apparatus>

Next, brief explanation will be made of the operation of the vacuum transfer apparatus 126 having the above-mentioned basic configuration.

When the rotary drive source 102 located on the atmospheric M side is driven, the rotary power is transmitted to the rotary drive shaft 105 of the arm 101 located on the vacuum N side through the intermediary of the magnetic fluid seal 104.

When the rotary drive shaft 105 is rotated, the arm support part 107 is rotated in association with the rotation thereof, and accordingly, the arm 101 attached to the arm support part 107 is rotated in a direction depending upon the rotating direction of the arm support part 107. Then, one of the belts 125 which are wound on and secured at their ends to the second pulleys 124 which are fitted respectively on the rotary shaft 118 of the first hand 122 and the rotary shaft 119 of the second hand 123 on opposite ends of the arm 101, and the first pulley 117 which is attached to the arm support part 107 through the intermediary of the rotary flange 108, is pulled by them so as to rotate the second pulleys 124. At this time, the other one of the belts 125 is slackened and is wound up on the second pulleys 124, and accordingly, the first hand 122 and the second hand 123 are rotated.

Thereby it is possible to transfer the samples such as semiconductor wafers 121 (examined wafer 127 and unexamined wafer 128) or the like which are set on and held by the first hand 122 and the second hand 122 (Refer to FIGS. 13A to 13I).

Further, when the vertical drive source 110 located on the atmospheric M side is driven, its rotation is transmitted to the ball screw 111 located on the vacuum N side through the intermediary of the magnetic fluid seal 104.

When the ball screw 111 is rotated, the pulley base 115 which is supported to the guide base 113 through the intermediary of the direct acting guide member 116 so as to be vertically movable, is moved up an down in dependence upon a rotating direction of the ball screw 111, and accordingly, there are also vertically moved the first pulley 117 attached to the pulley base 115, the rotary flange 108 attached to the first pulley 117, the arm support part 107 supported to the rotary flange 108 so as to be rotatable but vertically constrained, the arm 101 attached to the arm support part 107, and the first hand 122 and the second hand 123 rotatably supported to the opposite ends of the arm 101.

Accordingly, it is possible to effect vertical motion for moving up and down the samples such as the examined sample 127 and the unexamined sample 128 (Refer to FIGS. 17 and 18 which will be descried later).

<Explanation to Wafer Exchange Sequence in Vacuum Transfer Apparatus>

FIGS. 13A to 13I show an example of a wafer exchange sequence in the vacuum transfer apparatus according to the present invention.

Next, the wafer exchange sequence of the vacuum transfer apparatus 126 of this embodiment will be made with reference to FIGS. 13A to 13I. It is noted here that the examined wafer 127 and the unexamined wafer 128 will be exhibited instead of the semiconductor wafers 121. Further, reference will be made to FIGS. 16, 17 and 18 which will be described later.

Figure 13A:
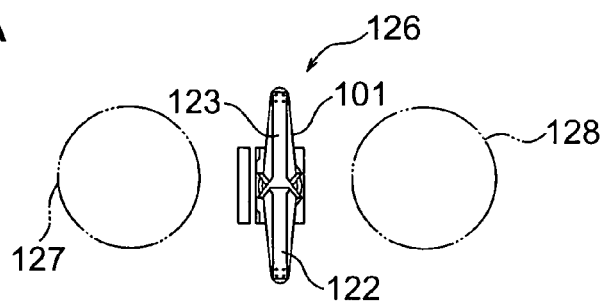

Before the start of the operation, the arm 101 normally rests in a condition in which the rotating angle is set to about 90 deg. In this condition, the first hand 122 and the second hand 123 are superposed on the arm 101, that is, this condition gives a minimum occupying area as shown in FIG. 13A. Further, the arm 101 has descended (Refer to FIG. 17 which will be described later).

Figure 13B:
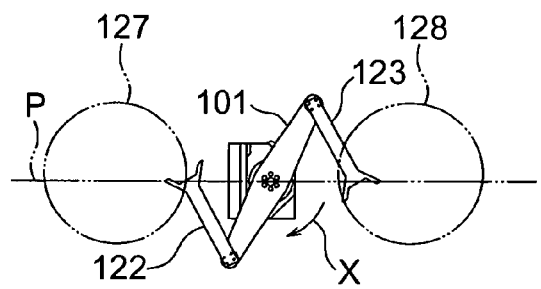
Figure 13C:
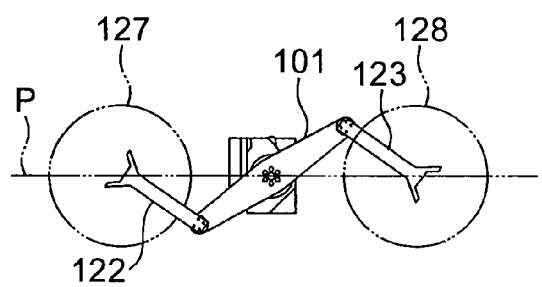

Further, the arm 101 is rotated clockwise by the rotary drive source 102 as indicated by the arrow X shown in FIG. 13B, toward the sample exchange position in order to carry out transfer and exchange of, for example, the examined wafer 127 for which the examination is completed in a vacuum sample chamber 134 which will be explained later, and the unexamined wafer 128 which has been fed in an auxiliary exhaust chamber 138 which will be explained later. Thus, by the power transmitted by the power transmission mechanism in association with this rotation, the first hand 122 and the second hand 123 are rotated counterclockwise, in a direction reverse to the rotating direction of the arm 101.

Further, due to the continuous rotation of the arm 101 up to the wafer setting position, the first hand 122 and the second hand 123 are extended underneath the unexamined wafer 128 and the examined wafer 127, respectively (Refer to FIG. 17). Thereafter, the arm 101 is moved upward by the vertical drive source 110 so as to set and hold the unexamined wafer 128 on the first hand 122 and the examined wafer 127 on the second hand 123 (Refer to the condition shown in FIG. 13C and FIG. 18). At this time, since the first hand 122 and the second hand 123 are arranged being vertically spaced from each other, the examined wafer 127 is at first set and held on the second hand 123, and thereafter, the unexamined wafer 127 is set and held on the first hand 122.

Figure 13D:
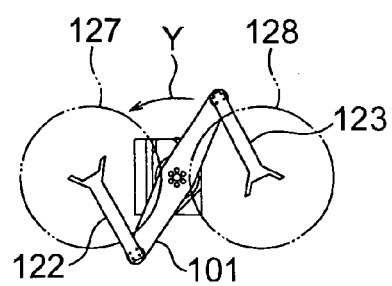
Figure 13E:
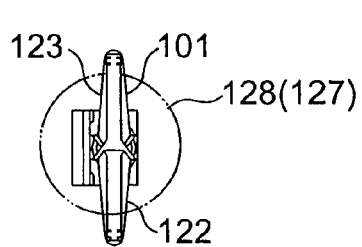
Figure 13F:
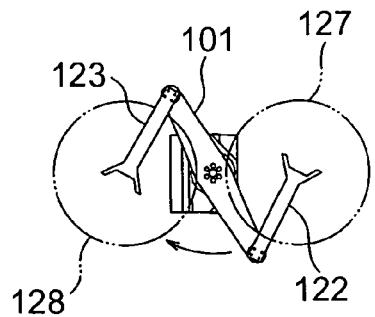

Next, in order to transfer and exchange the unexamined wafer 128 and the examined wafer 127, the arm 101 is rotated counterclockwise in a direction indicated by the arrow Y shown in FIG. 13D by the rotating drive source 102. Then, the first hand 122 carrying and holding thereon the unexamined wafer 128 and the second hand 123 for carrying and holding thereon the examined wafer 127 are rotated clockwise in a direction reverse to the rotating direction of the arm 101. The unexamined wafer 128 and the examined wafer 127 are vertically overlapped when the arm comes to an angle of 90 deg., as shown in FIG. 13E. Further, through the continuous counterclockwise rotation of the arm 101, the unexamined wafer 128 and the unexamined wafer 127 are directed respectively in their transfer directions as shown in FIG. 13F.

Figure 13G:
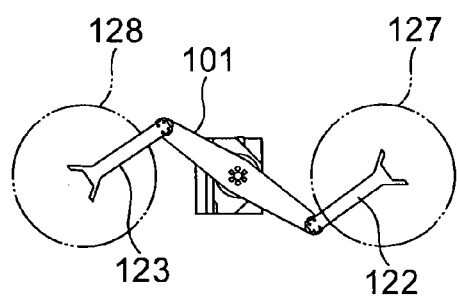

Further, as shown in FIG. 16, after the arm 101 is rotated up to the wafer setting position (the sample stage 135 and the auxiliary exhaust chamber 138), the arm 101 is moved downward by the vertical drive source 110 so as to set the unexamined wafer 128 and the examined wafer 127 on their respective places. At this time, since the first hand 122 and the second hand 123 are supported being vertically spaced, the examined wafer 127 set and held on the second hand 123 is at first separated, and then the unexamined wafer 128 set and held on the first hand 122 is separated. Thus, they are set on their respective places, and accordingly, the unexamined wafer 128 and the examined wafer 127 are completely exchanged as shown in FIG. 13G.

Figure 13H:
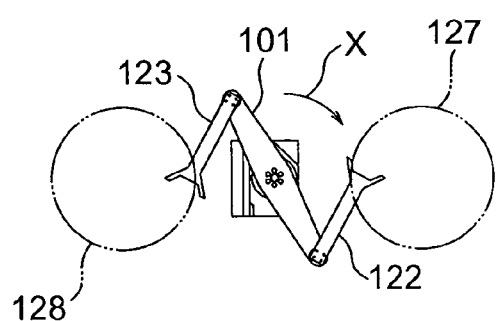
Figure 13I:
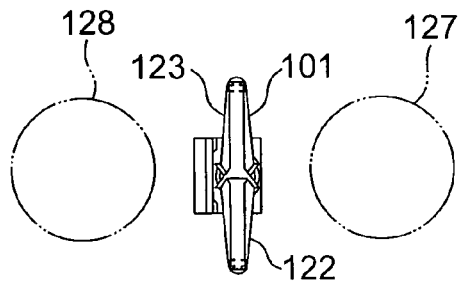

Next, the arm 101 is rotated clockwise by the rotating drive source 102 as shown in FIG. 13H. Further, after the continuous clockwise rotation of the arm 101 up to a rotating angle of about 90 deg., the rotation of the arm 101 is stopped, and accordingly, the wafer exchange sequence is completed as shown in FIG. 13I.

Thereafter, the sequence is repeated following the above-mentioned process steps from the condition shown in FIG. 13A.

Thus, by controlling the two operations, that is, the rotation and the vertical motion of the arm 101 in combination, the transfer, introduction and the delivery of the semiconductor wafers 121 may be completed in a short time for exchange.

In the case of transferring the wafers with the use of the vacuum transfer apparatus 126 according to the present invention, the center of the semiconductor wafer 121 may be rectilinearly moved, but a V-notch or the like also simultaneously rotated in dependence upon a rotating angle of the arm 101. Thus, when the semiconductor wafer 121 is fed, the rotating angle thereof is previously estimated before the supply thereof, thereby it is possible to prevent occurrence any problem.

As stated above, with the vacuum transfer apparatus 126 in this embodiment, the first hand 122 and the second hand 123 are rotatably supported to the opposite ends of the arm 101 which is supported in the vacuum N side so as to be rotated and vertically moved by the two drive sources 102, 110 for rotation and vertical motion, located on the atmospheric M side, and further, by means of the first pulley 117, the second pulleys 124 and the belts 125, the first hand 122 and the second hand 123 are rotated in association with the rotation of the arm 101. Thus, the transfer, instruction and delivery of samples such as the semiconductor wafers 121 for exchange, which are set on the first hand 122 and the second hand 123 may be simultaneously carried out only by controlling the drive sources 102, 110 for rotating and vertically moving the arm 101.

Thus, in the case of application to a semiconductor examination apparatus or the like, the delivery of the examined wafer 127 from the vacuum sample chamber 134 which will be explained later, and the transfer, the introduction and exchange of the unexamined wafer from the auxiliary exhaust chamber 138 into the vacuum sample chamber 134 may be simultaneously made, and accordingly, the transfer time may be greatly shortened, thereby it is possible to enhance the throughput.

Further, without the necessity of elevation drive portion for moving up and down the semiconductor wafer 121 with lift pins or the like, as used in a conventional apparatus, the delivery of the examined wafer 127 and the introduction of the unexamined wafer 128 may be simultaneously carried out only by controlling the rotation and the vertical motion of the arm 101 made to rotatably support the first hand 122 and the second hand 123 at its opposite ends, thereby it is possible to reduce a risk of contamination due to occurrence of foreign matter such as dust and dirt.

Further, without the necessity of a large number of joint drive sources and power transmission mechanisms therefore, as in a multiple joint arm type conventional apparatus, the delivery of the examined wafer 127 and the introduction of the unexamined wafer 128 may be simultaneously made, and accordingly, it can be expected to simplify the configuration of the apparatus in comparison with the conventional apparatus. Accordingly, it is possible to restrain failures so as to aim at enhancing the quality, and also it is possible to reduce a risk of contamination caused by occurrence of foreign matter such as dist and dirt according to a less number of movable components.

Further, the distance between the rotary drive shaft 105 of the arm 101 and the rotary shaft 118 of the first hand 122 and the distance between the rotary drive shaft 105 of the arm 101 and the rotary shaft 119 of the second hand 123 are set to be equal to the distance between the rotary shaft 118 of the first hand 122 and the sample setting center position P3 of the first hand, and the distance between the rotary shaft 119 of the second hand 123 and the sample setting center position P4 of the second hand 123, so as to allow the examined wafer 127 and the unexamined wafer 123 to be rectilinearly transferred, thereby the area of the opening 152 communicating the vacuum sample chamber 134 with the auxiliary exhaust chamber 138 may be decreased (Refer to FIGS. 16 and 17 which will be described). Further, loads applied to the vacuum transfer apparatus 126 during wafer exchange always act symmetrically with respect to the axis of the rotary drive shaft 105 of the arm 101, and accordingly no bias load is caused, thereby it is expectable to obtain such an effect that the apparatus may be small-sized in its entirety.

[Explanation to Vertical Drive Source for Arm in Another Embodiment]

FIG. 14 is a vertical sectional view illustrating another embodiment including the vertical drive source for vertically moving the arm. It is noted that the configuration is the same as that of the above-mentioned embodiments, except that the vertical drive source for vertically moving the arm 101 is different, and accordingly, like reference numerals are used to denote like parts in order to abbreviate duplicated explanation thereto.

As shown in FIG. 14, an air cylinder 142 for vertically moving the arm 101 is arranged on the atmospheric M side, and compressed air is fed to the air cylinder 142 under control by a solenoid valve 143. Thus, a power from the air cylinder 142 is introduced into the vacuum N side through vacuum bellows 144 which are vertically shrinkable and expandable in order to vertically move the pulley base 115.

Thus, with the use of the air cylinder 142 as the vertical drive source, the number of mechanical components may be greatly reduced, thereby it is expectable to miniaturize the apparatus and to save the cost.

[Explanation to Power Transmission Mechanism in Another Embodiment>

FIG. 15 is a schematic perspective view illustrating the power transmission mechanism in another embodiment.

It is noted that the configuration of this embodiment is basically the same as that of the above-mentioned embodiments except that a power transmission mechanism is different in structure from those stated above. Thus, like reference numerals are used to denote like parts in order to abbreviate the duplicated explanation thereto.

As shown in FIG. 15, a belt 150 formed of a single continuous steel belt or the like, is wound from the first pulley 117 to the respective second pulleys 124, and is applied thereto with a tensile force by a tension mechanism.

This tension mechanism includes a tension pulley 145 which is arranged between the first pulley 117 and the second pulleys 124, and which is rotatably supported to one end of a push arm 146 that is rotatably supported by a push arm rotary shaft 147.

Further, a press spring 148 as a resilient member is attached at its one end to the other end of the push arm 146, and is also supported at the other end to a push arm base 149 so as to apply a tensile force to the belt 150. The tensile force applied to the belt 150 by the press spring 148 is preferably set to a sufficient value with respect to a starting torque for the first hand 122 and the second hand 123.

With this configuration, the belt 150 may be always applied thereto with a constant tensile force, and accordingly, no rotational and positional slip is caused between the belt 150 and the first pulleys 117 and the second pulleys 124.

It is noted that the belt 150 may be successively formed at its entire inner peripheral side with a plurality of concavities and convexities, which are meshed with concavities and convexities formed on the first pulley 117 and the second pulleys 124 on which the belt 150 is wound. Further, another transmission mechanism using a plurality of gears may also be used.

The vacuum transfer apparatus 126, according to the first aspect of the present invention, configured as stated above, may be applied to a charged particle beam examination equipment or the like, in which a sample to be examined such as the semiconductor wafer 121 is introduced into the vacuum sample chamber 134 so as to carry out examination such as measurements for line widths, through-hole diameters and the like in view of an image picked up through scanning of the sample with a charged particle beam under a depressurized atmosphere.

<Explanation to Charged Particle Beam Examination Equipment>

FIG. 16 is a perspective view illustrating an embodiment of the charged particle beam equipment incorporating the vacuum transfer apparatus, and FIGS. 17 and 18 are enlarged sectional views illustrating parts of the examination equipment.

It is noted that a semiconductor inspection/measurement equipment utilizing an electron beam will be explained as an typical embodiment form of the charged particle beam examination/measurement equipment.

<Explanation to Semiconductor Examination Equipment>

Referring to FIG. 16, the semiconductor examination equipment is provided with an electron optical system 129 on a vacuum sample chamber 134 incorporated therein with a sample stage 135 for shifting the unexamined wafer 128 to a specific position, and further, the electron optical system 129 incorporates, in its lens barrel 131, a secondary particle detector 137 for detecting secondary particles (secondary electrons) produced by irradiation of an electron beam from the electron optical system 129. Further, an auxiliary exhaust chamber 138 that is communicated with the vacuum sample chamber 134 through the intermediary of a gate valve 139 with which the communication therebetween is openable and closable is arranged adjacent to the vacuum sample chamber 134, and moreover, a vacuum transfer apparatus 126 described above is provided in the vacuum sample chamber 134 for delivering and introducing the examined wafer 127 and the unexamined wafer 128 for exchange between the auxiliary exhaust chamber 138 and the vacuum sample chamber 134.

It is noted that the above-mentioned specific position for the sample stage 135 which carries the unexamined wafer 128 to the specific position does mean a scanning range of the electron beam from the electron optical system 129, that is, it is a position in the vacuum chamber 134, right below the electron optical system 129.

<Explanation to Electron Optical System>

The electron optical system 129 incorporates an electron gun 130, as shown in FIG. 16, in the topmost part of the lens barrel 131 provided on the vacuum sample chamber 134 in such a condition that it is communicated with the vacuum sample chamber 134, and electron lenses including a focusing lens 132 and an objective lens 133 for focusing the electron beam emitted from the electron gun 130 into a thin spot on the unexamined wafer 128 which has been introduced to and set on the sample stage 135 in the vacuum sample chamber 134 by means of the vacuum transfer apparatus 126 are incorporated in the lens barrel 131.

The electron beam is focused into a thin sport on the unexamined wafer 128 introduced to and set on the sample stage 135 in the vacuum sample chamber 134 by means of the above-mentioned vacuum transfer apparatus 126.

The unexamined wafer 128 is scanned with the electron beam in one direction or two-dimensionally with a high degree of accuracy by means of a deflector 136, and the scanning range by the electron beam is small. Accordingly, the unexamined wafer 128 is moved by the sample stage 135 up to the above-mentioned scanning range so as to irradiate the electron beam onto the unexamined wafer 128. Further, the secondary particles from the unexamined wafer 128 are detected by the secondary particle detector 137 in order to carry out examination such as measurement of line widths or the like from an image picked up thereby.

<Explanation to Vacuum Sample Chamber>

As shown in FIGS. 16, 17 and 18, the vacuum transfer apparatus 126 as stated above is provided in the vacuum sample chamber 134 so as to carry out introduction and delivery of the unexamined wafer 128 and the examined wafer 127 for exchange. Further, there is provided an installation space 151 in which only the vacuum transfer apparatus 126 is arranged adjacent to the vacuum sample chamber 134.

Further, the auxiliary exhaust chamber 138 is provided adjacent to the vacuum sample chamber 134 through the intermediary of the above-mentioned installation space 151, as shown in FIGS. 16, 17 and 18, and an opening 152 for transferring the wafers is formed between the auxiliary exhaust chamber 138 and the vacuum sample chamber 134. The opening 152 is fitted therein with a gate valve 139 so as to be openable and closable.

With this configuration, when the opening 152 is closed by the gate valve 139, only the auxiliary exhaust chamber 138 is opened to the atmosphere by opening a gate valve 140 provided in the auxiliary exhaust chamber 138 without the vacuum sample chamber 134 being opened to the atmosphere, and accordingly, in this condition, the introduction of the unexamined wafer 128 and the delivery of the examined wafer 127 into and from the auxiliary exhaust chamber 138 may be made.

<Explanation to the Auxiliary Exhaust Chamber>

As shown in FIGS. 16, 17 and 18, the auxiliary exhaust chamber 138 is formed therein with the opening 153 through which the unexamined wafer 128 is introduced thereinto or the examined wafer 127 is delivered therefrom, and the gate valve 140 is attached to the opening 153. Further, the bottom part of the auxiliary exhaust chamber 138 is formed therein with a recess 154 which defines a suitable opening form, having a minimum depth which is necessary for preventing interference with the vacuum transfer apparatus 126 during the exchange of the unexamined wafer 128 and the examined wafer 127 through the introduction and the deliver thereof. That is, the first hand 122 and the second hand 123 of the vacuum transfer apparatus 126 are made to enter into the recess 154 in order to lift up the unexamined wafer 128 for receiving thereof and to lower the examined wafer 127 for returning thereof into the auxiliary exhaust chamber 138.

<Explanation to Sample Stage>

As shown in FIGS. 16, 17 and 18, in order to prevent interference with the vacuum transfer apparatus 126 during exchange of the unexamined wafer 128 and the examined wafer 127 through the introduction and delivery thereof, the sample stage 135 is provided thereon with lift pins 141 for vertically moving each of the wafers 128, 127 during exchange of the unexamined wafer 128 and the examined wafer 127 through the introduction and delivery thereof.

It is noted the lift pins 141 may be of a stationary type, although not shown in the drawings, while the sample stage 135 may be vertically moved. Further, similar to the auxiliary exhaust chamber 138, the sample stage 135 may be formed therein with a recess having a minimum depth necessary for preventing interference with the vacuum transfer apparatus 126.

Further, the vacuum sample chamber 134 and the auxiliary exhaust chamber 138 may be evacuated so as to obtain a depressurized vacuum atmosphere by an exhaust means which is not shown.

With the above-mentioned configuration, the auxiliary exhaust chamber 138 only has a volume for accommodating therein the semiconductor wafer 121 (the unexamined wafer 128 and the examined wafer 127) and the gate valve 139 and a volume which is necessary for transfer, thereby it is possible to minimize the volume of the auxiliary exhaust chamber 138. Thus, the exhausting time for the auxiliary exhaust chamber 138 may be greatly shortened, thereby it is possible to enhance the throughput. Further, since no drive part is present in the auxiliary exhaust chamber 138, no foreign matter such as dust and dirt which cause contamination is produced, thereby it is possible to greatly reduce the possibility of contamination.

<Explanation to Sequence of Wafer Exchange in Semiconductor Examination Equipment>

Next, explanation will be made of the sequence of wafer exchange in the semiconductor examination equipment in this embodiment with reference to FIGS. 4, 17 and 18 as described above.

Usually, in the semiconductor examination equipment, the unexamined wafer 128 is possibly present in the vacuum sample chamber 134 so as to examine the wafer 128 with the use of an electron beam for line examination. At this time, the gate valve 139 has been closed, and the vacuum transfer apparatus 126 is set in a condition shown in FIG. 13A. During this period, the gate valve 140 is opened so as to feed a next unexamined wafer 128 into the auxiliary exhaust chamber 138 from the outside. Thereafter, the gate valve 140 is closed, and the auxiliary exhaust chamber 138 is evacuated down to a predetermined depressurized condition by the exhaust means which is not shown.

Further, when the examination for the unexamined wafer 128 is completed in the vacuum sample chamber 134, the sample stage 135 is shifted to the sample exchange position and the examined wafer 127 is lifted by the lift pins 141. After the examined wafer is lifted up away from the sample stage 135, the opening 152 is opened by the gate valve 139, and accordingly, the vacuum transfer apparatus 126 is operated through the process steps shown in FIGS. 13A to 13I as described above, so as to carry out the exchange of the unexamined wafer 128 and the examined wafer 127 through the introduction and delivery thereof.

After the unexamined wafer 128 is introduced to and set on the sample stage 135 while the examined wafer 127 is returned into the auxiliary exhaust chamber 138 so as to cause the vacuum transfer apparatus 126 falls in the condition shown in FIG. 13I, the opening 152 is closed by the gate valve 139, and then nitrogen is supplied in the auxiliary exhaust chamber 138 up to the atmospheric pressure. When the auxiliary chamber 138 is returned up to the atmospheric pressure, the opening 153 which has been closed by the gate valve 140 is opened so as to deliver and withdrawn the examined wafer 127 while a new unexamined wafer 128 is introduced and fed into the auxiliary exhaust chamber 138.

Thereafter, the above-mentioned process steps are repeated so as to introduce the examined wafer 127 and deliver the unexamined wafer 128.

According to the semiconductor examination/measurement equipment (charged particle beam examination/measurement equipment) in the above-mentioned embodiment, since the vacuum transfer apparatus 126 is arranged not in the auxiliary exhaust chamber 138, but in an installation space 151 adjacent to the vacuum sample chamber 134, the auxiliary exhaust chamber 138 may be restrained to a volume which accommodates the samples such as the examined wafer 127 and the unexamined wafer 128 and a volume which is required for the transfer of the samples. Thereby, it is possible to set the volume of the auxiliary exhaust chamber 138 to a necessary minimum value. Thus, it is possible to materialize foot print saving (foot space saving). Further, after the delivery and withdrawal and the introduction and supply of the semiconductor wafer 121, the time of exhaustion of the auxiliary chamber 138 may be greatly shortened, thereby it is possible to enhance the throughput. Thus, it is expectable to reduce the production cost of semiconductor wafers or the like.

Further, since no elevation drive parts such as lift pins is present in the auxiliary exhaust chamber 138, thereby it is possible to materialize a clean auxiliary exhaust chamber 138 which may restrain occurrence of foreign matter such as dust and dirt which cause contamination, thereby it is possible to greatly restrain lowering of a quality of semiconductor wafers because of adhesion of foreign matter.

The present invention should not be limited to the specific embodiments as stated above, but various design modifications may be made thereto without departing the concept of the present invention.

For example, if the time of the examination in the vacuum sample chamber 134 is shorter than the time of exhaustion in the auxiliary exhaust chamber 138, the sample stage 135 has to stand by at the sample exchange position until the auxiliary exhaust chamber 138 is exhausted, resulting in a problem of lowering the throughput. In this case, for example, the vacuum sample chamber 134 may be provided with a plurality of auxiliary exhaust chambers 138 and a plurality of vacuum transfer apparatuses 126.

Further, in the embodiments as stated above, although the explanation has been made of exchange of the semiconductor wafers through the introduction and delivery thereof for exchange, the present invention may be applied to other samples including mask substrates, other than the semiconductor wafers. Further, the present invention may not only be used for the transfer of samples but may be used as a transfer means for transferring a sample holder.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A charged particle beam equipment comprising:
   a sample chamber having a first internal space for irradiating a focused beam onto a wafer in a vacuum condition;
   a sample stage for shifting said wafer in said first internal space;
   a load lock chamber having a second internal space which is changed over between a vacuum condition and an atmospherically opened condition;
   a wafer exchange portion for exchanging said wafer on said sample stage with another wafer; and
   a gate valve allowing said wafers to be exchanged to pass through, for communicating and isolating between said first internal chamber and said second internal chamber,
   wherein said wafer exchange portion comprises:
   a first arm which is slid longitudinally so as to reciprocate between said first internal space and said second internal space;
   a first wafer gripping part provided at a distal end of said first arm, for gripping and releasing said wafer on said sample stage;
   a second arm which is slid longitudinally so as to reciprocate between said first internal space and said second internal space; and
   a second wafer gripping part provided at a distal end of said second arm, for gripping and releasing said wafer on said sample stage.

2. A charged particle beam equipment as set forth in claim 1, wherein said wafer exchange part further comprises:
   first slide bases provided with said first arm and said second arm which slide independently from each other; and
   second slide bases for vertically sliding said first slide bases.

3. A charged particle beam equipment as set forth in claim 1, wherein said first wafer gripping part and/or said second wafer gripping part comprise a wafer holder which has a structure that said wafer is set on a upper surface, and a bottom surface is secured to said sample stage; and a disconnectable mechanism for disconnectably connecting said wafer holder with said first arm and/or said second arm.

4. A charged particle beam equipment as set forth in claim 1, wherein said first arm and/or said second arm are provided in their intermediate parts with joint parts so as to be flexed.

5. A vacuum transfer apparatus comprising:

rotary and vertical drive sources;

an arm supported so as to be rotated and vertically moved by said rotary and vertical drive sources;

a first hand rotatably supported at one end of said arm, and rotated in association with rotation of said arm, for carrying thereon a sample;

a second hand rotatably supported at the other end of said arm, and rotated in association with rotation of said arm, for carrying thereon a sample; and a power transmission mechanism for transmitting the rotation of said arm from a rotary drive shaft of said arm to respective rotary shafts of said first hand and said second hand, wherein said first hand and said second hand are supported being vertically spaced from each other.

6. A vacuum transfer apparatus as set forth in claim 5, wherein a revolution ratio between said arm and said first hand and a revolution ratio between said arm and said second hand are set to 1:2, distances from a rotary drive shaft of said arm to a rotary shaft of said first hand and to a rotary shaft of said second hand are set to be equal to a distance between said rotary shaft of said first hand and a sample carrying center position of said first hand, and a distance between said rotary shaft of said second hand and a sample carrying center position of said second hand, and said samples respectively carrying on said first hand and said second hand are transferred rectilinearly.

7. A vacuum transfer apparatus as set forth in claim 5, wherein said power transmission mechanism comprises a first pulley provided on said rotary drive shaft of said arm, second pulleys provided respectively on said rotary shafts of said first hand and said second hand, and a belt, wherein opposite ends of said belt are secured to said first pulley and said second pulleys, respectively.

8. A vacuum transfer apparatus as set forth in claim 5, wherein said power transmission mechanism comprises a first pulley provided on said rotary drive shaft of said arm, second pulleys provided respectively on said rotary shafts of said first hand and said second hand, a belt wound between and around said first pulley and said second pulleys, and tension mechanism attached to said arm, for applying a tensile force to said belt, wherein said tension mechanism comprises a tension pulley, a push arm supporting at its one end said tension pulley, a push arm rotary shaft rotatably supporting the other end of said push arm, and a resilient member for resiliently pressing said push arm.

9. A vacuum transfer apparatus as set forth in claim 5, wherein said vertical drive source comprises an air cylinder, and vacuum bellows for introducing a power from said air cylinder into the vacuum area.

10. A charged particle beam examination equipment comprising:

a charged particle beam optical system having a function for irradiating a charged particle beam, and focusing said charged particle beam onto said sample after deflection;

a secondary particle detector for detecting second particles generated by said irradiation of said charged particle beam;

a vacuum sample chamber into which said sample is introduced;

an auxiliary exhaust chamber arranged adjacent to said vacuum sample chamber so as to introduce and deliver said sample; and a sample stage for shifting said introduced sample to a specific position within said vacuum sample chamber, wherein said vacuum sample chamber is provided therein with said vacuum transfer apparatus as set forth in claim 5, for transferring said samples so as to deliver and introduce the same between said auxiliary exhaust chamber and said vacuum sample chamber.

* * * * *